United States Patent
Mizuuchi et al.

(10) Patent No.: US 7,304,880 B2
(45) Date of Patent: Dec. 4, 2007

(54) ELECTRIC SWITCH AND MEMORY DEVICE USING THE SAME

(75) Inventors: Kiminori Mizuuchi, Neyagawa (JP);
Kazuhisa Yamamoto, Takatsuki (JP);
Tomoya Sugita, Moriguchi (JP);
Akihiro Morikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 119 days.

(21) Appl. No.: 10/555,941

(22) PCT Filed: May 7, 2004

(86) PCT No.: PCT/JP2004/006504

§ 371 (c)(1),
(2), (4) Date: Nov. 7, 2005

(87) PCT Pub. No.: WO2004/107466

PCT Pub. Date: Dec. 9, 2004

(65) Prior Publication Data

US 2007/0069263 A1    Mar. 29, 2007

(30) Foreign Application Priority Data

May 8, 2003 (JP) .............................. 2003-130102
Sep. 18, 2003 (JP) .............................. 2003-325806

(51) Int. Cl.
*G11C 11/22* (2006.01)

(52) U.S. Cl. ........................ 365/145; 365/65; 365/117

(58) Field of Classification Search ................ 365/145, 365/65, 117
See application file for complete search history.

(56) References Cited

U.S. PATENT DOCUMENTS

| | | | | |
|---|---|---|---|---|
| 3,945,099 A | * | 3/1976 | Kansy | 29/25.35 |
| 5,519,234 A | * | 5/1996 | Paz de Araujo et al. | 257/295 |
| 5,687,265 A | * | 11/1997 | Nishimoto et al. | 385/40 |
| 5,812,442 A | | 9/1998 | Yoo | |
| 6,342,177 B1 | * | 1/2002 | Kitaoka | 264/307 |
| 6,542,285 B1 | * | 4/2003 | Batchko et al. | 359/326 |
| 6,690,598 B2 | * | 2/2004 | Oguchi et al. | 365/145 |
| 6,730,522 B1 | | 5/2004 | Nakamura et al. | |

FOREIGN PATENT DOCUMENTS

| | | | |
|---|---|---|---|
| JP | 63-193581 | | 8/1988 |
| JP | 7-058224 | | 3/1995 |
| JP | 10-56141 | | 2/1998 |
| JP | 11017124 | * | 1/1999 |
| WO | 91/06121 | | 5/1991 |
| WO | 02/37500 | | 5/2002 |

OTHER PUBLICATIONS

Sonoda, et al., "Second harmonic generation in electric poled X-cut MgO-doped $LiNbO_3$ waveguides", Appl. Phys. Lett. 70(23), American Institute of Physics, 1997.

Watanabe, et al., "Current-driven insulator-conductor transition and nonvolatile memory in chromium-doped $SrTiO_3$ singe crystals", Appl. Phys. Lett. vol. 78 (23), American Institute of Physics, 2001.

* cited by examiner

*Primary Examiner*—Anh Phung
*Assistant Examiner*—Nam Nguyen
(74) *Attorney, Agent, or Firm*—Hamre, Schumann, Mueller & Larson, P.C.

(57) ABSTRACT

An electric switch includes a ferroelectric substrate to which metal is added, a pair of electrodes provided on the ferroelectric substrate, and an electric field applying portion for changing the direction of polarization in part of the ferroelectric substrate.

37 Claims, 15 Drawing Sheets

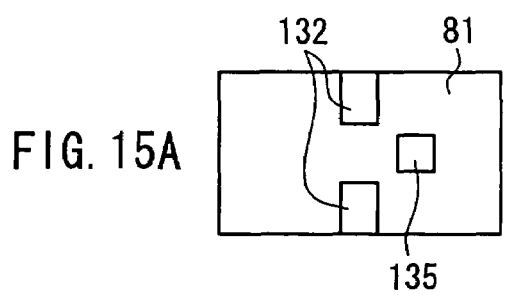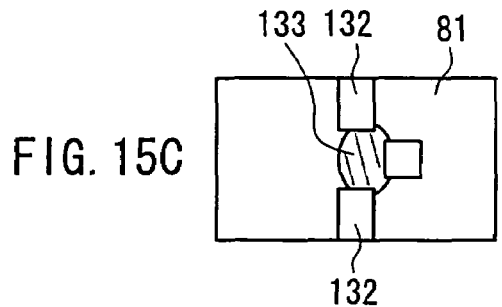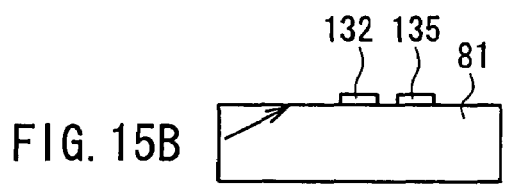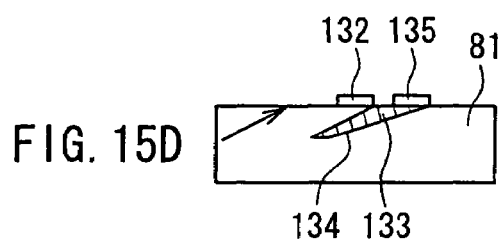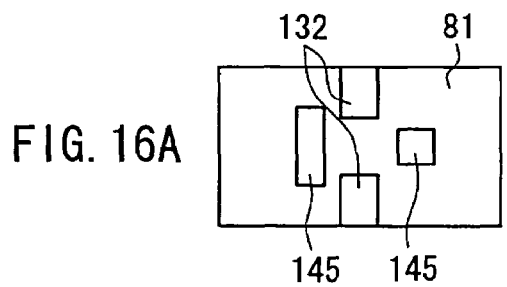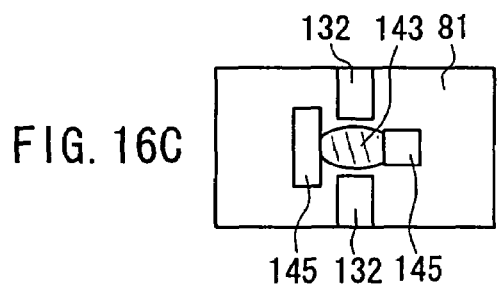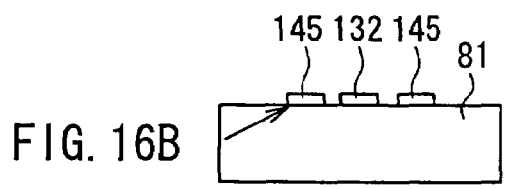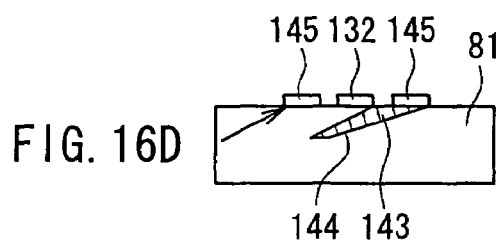

ELECTRIC SWITCH AND MEMORY DEVICE USING THE SAME

TECHNICAL FIELD

The present invention relates to an electric switch that utilizes a change in conductivity due to a change in spontaneous polarization of a ferroelectric and a memory device using the electric switch.

BACKGROUND ART

A ferroelectric has spontaneous polarization, and the polarization direction can be controlled. For example, a ferroelectric memory utilizes the variability in spontaneous polarization of a ferroelectric. When a voltage is applied to the ferroelectric, the direction of the spontaneous polarization is changed, and electric charge moves according to this change. These properties of the ferroelectric can be used to form an electric switch, and the ferroelectric memory including the electric switch serves as a nonvolatile memory. It is known that a change in conductivity due to a change in spontaneous polarization can cause a leakage current in the ferroelectric memory. Therefore, a method or the like for preventing the change in conductivity has been studied to deal with the leakage current. A technique of using the leakage current also has been proposed (see JPN 10 (1998)-56141 A). Moreover, as an example of using the polarization of a ferroelectric, an electric switch has been proposed that utilizes a change in electric conductivity caused by an overcurrent.

Regarding the polarization of a ferroelectric, there has been a report that domain-inverted regions of an X-plate Mg-doped $LiNbO_3$ exhibit rectification properties and decrease in resistance (see S. Sonia, I. Tubular, and M. Hater; Applied Physics Letters, vol. 70, pp. 3078-3079, 1997).

Another report has shown an electric switch that changes the electric conductivity by allowing an overcurrent to flow through the ferroelectric (see Y Waianae, J. G. Boxer, A. Bisects, Co. Gabber, D. Wider, A. Beck; Applied Physics Letters, vol. 78, pp. 3738-3740, 2001).

As described above, there are various techniques to use the polarization of a ferroelectric. In the ferroelectric memory, the insulating properties are reduced due to a change in spontaneous polarization. This phenomenon may degrade the characteristics of the ferroelectric memory. The degradation of the characteristics means that the conductivity is changed by approximately several to several tens of times.

The advantages of stability, mass-productivity, and reliability in commercially available ferroelectric memories that utilize a change in spontaneous polarization of a ferroelectric have been demonstrated by their wide application. However, when an electric field is produced by the movement of electric charge according to a reversal of the spontaneous polarization, the conventional ferroelectric memories only use the electric field indirectly as a voltage to drive a semiconductor switch. Therefore, the configuration is complicated, and the degree of integration is restricted. Moreover, the conventional ferroelectric memories are not sufficient, e.g., for the memory life, the number of repeated switching operations, and the time for storing nonvolatile charge. On the other hand, attempts are being made to use a change in spontaneous polarization directly for switching. However, it has not been accomplished yet because appropriate ferroelectric materials are not found.

DISCLOSURE OF INVENTION

Therefore, with the foregoing in mind, it is an object of the present invention to provide an electric switch that includes a ferroelectric and can achieve a high degree of integration with a simple configuration, and a memory device using the electric switch.

An electric switch of the present invention includes the following: a ferroelectric substrate to which a metal is added; a pair of electrodes provided on the ferroelectric substrate; and an electric field applying portion for changing a direction of polarization in part of the ferroelectric substrate. A resistance value of the ferroelectric substrate is changed by changing the direction of the polarization.

A memory device of the present invention includes a plurality of electric switches of the present invention and stores the resistance value of the ferroelectric substrate of each of the electric switches.

BRIEF DESCRIPTION OF DRAWINGS

FIG. 15A is a plan view showing the configuration of a fifth electric switch in Embodiment 4 of the present invention.

FIG. 15B is a cross-sectional view showing the configuration of the fifth electric switch in Embodiment 4 of the present invention.

FIG. 15C is a plan view showing the configuration of the fifth electric switch in Embodiment 4, in which a domain wall is generated.

FIG. 15D is a cross-sectional view showing the configuration of the fifth electric switch in Embodiment 4, in which a domain wall is generated.

FIG. 16A is a plan view showing the configuration of a sixth electric switch in Embodiment 4 of the present invention.

FIG. 16B is a cross-sectional view showing the configuration of the sixth electric switch in Embodiment 4 of the present invention.

FIG. 16C is a plan view showing the configuration of the sixth electric switch in Embodiment 4, in which a domain wall is generated.

FIG. 16D is a cross-sectional view showing the configuration of the sixth electric switch in Embodiment 4, in which a domain wall is generated.

DESCRIPTION OF THE INVENTION

Figure 1A:
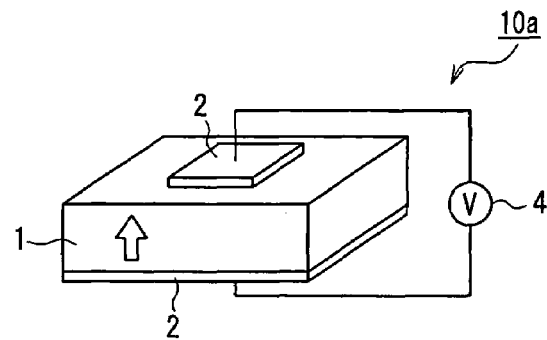
FIG. 1A is a perspective view showing the configuration of an electric switch in Embodiment 1 of the present invention.

The electric switch of the present invention controls the spontaneous polarization of a ferroelectric and significantly changes the electric conductivity of the ferroelectric to perform switching. The ferroelectric can be used directly as a switch, so that the electric switch can achieve a high degree of integration with a simple configuration.

It is preferable that the ferroelectric substrate is an oxide. Accordingly, the ferroelectric substrate has high insulating properties, and a large resistance change can be achieved by switching.

It is preferable that the ferroelectric substrate is made of a single domain ferroelectric material, and the electric field applying portion applies an electric field in the direction opposite to the polarization of the ferroelectric substrate. The polarization direction is aligned, and thus the electric switch can be driven at a low voltage.

It is preferable that while the polarization is reversed, the ferroelectric substrate retains an internal electric field that is opposite to the reversed polarization. Accordingly, a change in resistance of the ferroelectric substrate can be observed.

It is preferable that the electric field applying portion applies an electric field to the ferroelectric substrate, and the electric field is an alternating-current electric field with a frequency of 5 Hz or more. The resistance of the ferroelectric substrate is not changed over time, making the electric switch stable.

It is preferable that the electric field applying portion applies an electric field to the ferroelectric substrate, and the electric field is a high-frequency superimposed electric field. This can reduce the current required for reversion of the low-resistance ferroelectric substrate to a high resistance state. Thus, the driving power of the electric switch can be reduced.

It is preferable that the metal added to the ferroelectric substrate is at least one selected from the group consisting of Mg, Zn, In, SC, Cu, and Fe, and the ferroelectric substrate is $LiNbO_3$. Accordingly, a change in the resistance of the ferroelectric substrate can be observed.

The ferroelectric substrate may be a Z plate of $LiNbO_3$ to which the at least one metal is added.

The ferroelectric substrate may be a ferroelectric crystal that is treated to have a single domain structure. The polarization direction is aligned, and thus the electric switch can be driven at a low voltage.

It is preferable that the ferroelectric substrate is made of a polycrystalline or amorphous material. The ferroelectric substrate can be a thin film, and thus facilitates the fabrication because crystal growth of the bulk is not necessary.

It is preferable that the pair of electrodes is formed along the direction of spontaneous polarization of the ferroelectric substrate, and the direction of polarization in part of the ferroelectric substrate is controlled by applying an electric field between the pair of electrodes with the electric field applying portion, so that the resistance between the pair of electrodes is controlled. Accordingly, the electric switch can be configured.

It is preferable that the electric switch further includes a pair of electrodes formed in a direction substantially perpendicular to the direction of spontaneous polarization of the ferroelectric substrate, and the direction of polarization in part of the ferroelectric substrate is controlled by applying an electric field between the pair of electrodes formed along the direction of the spontaneous polarization with the electric field applying portion, so that the resistance between the pair of electrodes formed in the direction substantially perpendicular to the direction of the spontaneous polarization is controlled. Accordingly, the electric switch can be configured.

It is preferable that when the electric field applying portion applies an electric field to the ferroelectric substrate, the direction of polarization of the ferroelectric substrate is changed in 10% to 90% of a region where the electric field is applied. Accordingly, the resistance value of the ferroelectric substrate can be controlled in a region where the electric field is applied.

The direction of spontaneous polarization of the ferroelectric substrate may be substantially perpendicular to the surface of the ferroelectric substrate.

The direction of spontaneous polarization of the ferroelectric substrate may be substantially parallel to the surface of the ferroelectric substrate.

It is preferable that a maximum resistance value is at least 100 times as large as a minimum resistance value of the ferroelectric substrate. Accordingly, the electric switch can be operated.

It is preferable that at least one of the pair of electrodes is a comb-shaped electrode. The expansion of a domain inversion becomes faster.

The ferroelectric substrate may be a single domain crystal, and the direction of electrode fingers of the comb-shaped electrode may be substantially parallel to the Y-axis direction of the crystal.

It is preferable that the electric field applying portion controls the direction of polarization of the ferroelectric substrate so that a domain wall that is a boundary separating different polarization directions is formed or removed in the vicinity of a region between the pair of electrodes, thereby changing the resistance value between the pair of electrodes. With this configuration, the electric switch can be achieved.

It is preferable that grooves are formed in the surface of the ferroelectric substrate, and the pair of electrodes is provided in the grooves. Accordingly, the electric field distribution can be uniform, and a smaller voltage is used to drive the electric switch. Moreover, the influence of surface charge is reduced to enhance the insulating properties between the pair of electrodes.

It is preferable that the concentration of the added metal is 1 mol % or more. Accordingly, a change in resistance of the ferroelectric substrate can be larger.

It is preferable that the direction of spontaneous polarization of the ferroelectric substrate tilts with respect to the surface of the ferroelectric substrate. This ferroelectric substrate is an off-cut substrate in which the direction of the spontaneous polarization obliquely crosses the substrate surface. Thus, the ferroelectric substrate can have high conformability of polarization and good reproducibility of a uniform domain inversion.

It is preferable that a pair of polarizing electrodes is provided on the surface of the ferroelectric substrate, and the electric field applying portion applies an electric field between the pair of polarizing electrodes. The electrodes for polarizing the ferroelectric substrate can be separated from the electrodes for allowing a current to flow through the ferroelectric substrate to detect the resistance value. Thus, the electric switch can be driven efficiently.

It is preferable that a pair of polarizing electrodes is provided in grooves formed in the surface of the ferroelectric substrate, and the electric field applying portion applies an electric field between the pair of polarizing electrodes.

Accordingly, the electric field distribution can be uniform, and a smaller voltage is used to drive the electric switch. Moreover, the influence of surface charge is reduced to enhance the insulating properties between the pair of electrodes.

The electric field applying portion may be an electric switching element made of a semiconductor material.

A heating portion may be provided to heat the ferroelectric substrate. By heating the ferroelectric substrate, the electric switch can be driven at a low voltage.

The ferroelectric substrate may have an ilmenite structure. The resistance of the ferroelectric substrate can be decreased significantly.

It is preferable that a current flows between the pair of electrodes by the movement of electric charge of the ferroelectric substrate while the direction of the polarization is changed, so that the resistance value between the pair of electrodes is changed. Accordingly, a minimum of 2Ps×S electric charge flows, and the resistance value is increased by double figures or more. Thus, the electric switch can be used successfully.

It is preferable that the ferroelectric substrate is subjected to a poling process so that the spontaneous polarization is oriented substantially in one direction. The polarization direction can be aligned without causing any distortion in the crystal.

It is preferable that an insulating layer is provided between at least one of the pair of electrodes and the ferroelectric substrate. Accordingly, the electric field applied for reversing the polarization can be reduced, and the electric switch can be driven with low power consumption.

A memory device of the present invention includes a plurality of electric switches of the present invention. Accordingly, a nonvolatile memory having a high degree of integration with a simple configuration can be achieved.

It is preferable that the plurality of electric switches are arranged two-dimensionally. Thus, a two-dimensional memory can be achieved easily.

It is preferable that the plurality of electric switches are formed on a semiconductor integrated circuit, and the electric field applying portions are controlled by the semiconductor integrated circuit. Accordingly, each of the electric switches can be controlled easily.

It is preferable that the resistance value of the ferroelectric substrate of each of the electric switches is controlled and detected by the semiconductor integrated circuit. This can facilitate both storing information and reading the stored information.

It is preferable that the memory device further includes a light radiating portion for irradiating the ferroelectric substrate of each of the electric switches with light having a wavelength of 500 nm or less. With this configuration, all the ferroelectric substrates can be irradiated with light to increase the resistance of all the electric switches. Thus, the memory device can erase the stored information collectively.

It is preferable that the memory device further includes a heating portion for heating the ferroelectric substrate of each of the electric switches. With this configuration, all the ferroelectric substrates can be heated to increase the resistance of all the electric switches. Thus, the memory device can erase the stored information collectively.

The electric switch and the memory device using the electric switch of the present invention utilize a large change in conductivity of a ferroelectric due to a change in spontaneous polarization of the ferroelectric by the application of an electric field. Specifically, the ferroelectric varies significantly in conductivity from an insulator to a semiconductor and vice versa according to the change in spontaneous polarization. This phenomenon had not been known until the present inventors found it based on the experimental results. The variable conductivity of the ferroelectric is used to achieve the electric switch and the memory device.

Hereinafter, embodiments of the present invention will be described specifically.

EMBODIMENT 1

Figure 1B:
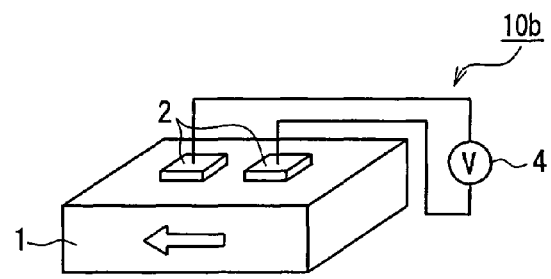
FIG. 1B is a perspective view showing the configuration of another electric switch in Embodiment 1 of the present invention.

The following is an explanation of electric switches in Embodiment 1 of the present invention. FIG. 1A is a perspective view showing the configuration of an electric switch 10a. FIG. 1B is a perspective view showing the configuration of another electric switch 10b. As shown in FIG. 1A, the electric switch 10a includes a ferroelectric substrate 1 to which a metal is added, a pair of electrodes 2, and a voltage source (electric field applying portion) 4. The pair of electrodes 2 is provided on the ferroelectric substrate 1. The arrow of FIG. 1A indicates the direction of polarization of the ferroelectric substrate 1. Each of the pair of electrodes 2 is connected to the voltage source 4. The pair of electrodes 2 is placed respectively on the surface and back of the ferroelectric substrate 1, and these electrodes are arranged along the direction of the polarization.

The operation of the electric switch 10a is described below. First, when no electric field is applied to the pair of electrodes 2, the ferroelectric substrate 1 is an insulator, and the conductivity is low. In other words, no current flows between the pair of electrodes 2 due to high resistance. Then, an electric field is applied by the voltage source 4 in the direction opposite to the spontaneous polarization of the ferroelectric substrate 1. The voltage source 4 can apply an electric field to the ferroelectric substrate 1, thereby changing the direction of polarization in part of the ferroelectric substrate 1. When the spontaneous polarization is reversed fully to complete a domain inversion, the conductivity between the pair of electrodes 2 is improved. That is, the resistance is low enough to allow a current to flow between the pair of electrodes 2. Next, an electric field is applied to the ferroelectric substrate 1 by the voltage source 4 in the direction opposite to the reversed polarization (i.e., in the original direction of the spontaneous polarization). Consequently, the ferroelectric substrate 1 returns to the original state with the spontaneous polarization (reversion). In this state, the resistance between the pair of electrodes 2 becomes high again. The ferroelectric substrate 1 can be electrically conductive or nonconductive between the pair of electrodes 2 by controlling the voltage source 4, and thus acts as a switch.

FIG. 1B is a perspective view showing the configuration of another electric switch in Embodiment 1. FIG. 1B differs from FIG. 1A in that the direction of the spontaneous polarization of a ferroelectric substrate 1 is parallel to the surface of the ferroelectric substrate 1, as indicated by the arrow in FIG. 1B, and a pair of electrodes 2 is placed in the same plane of the ferroelectric substrate 1 and arranged side-by-side along the direction of the spontaneous polarization. This configuration also can change the direction of polarization in part of the ferroelectric substrate 1 between the pair of electrodes 2 by controlling a voltage source 4. Thus, the ferroelectric substrate 1 can be electrically conductive or nonconductive between the pair of electrodes 2.

Figure 2A:
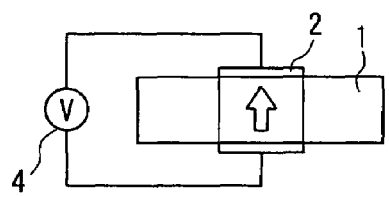
FIG. 2A is a diagram showing a polarization direction when a voltage is applied to a ferroelectric substrate.
Figure 2B:
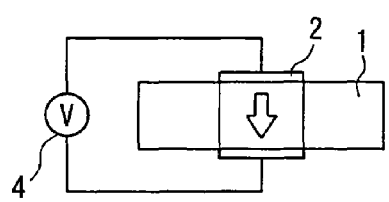
FIG. 2B is a diagram showing a polarization direction when a voltage is applied to a ferroelectric substrate.
Figure 2C:
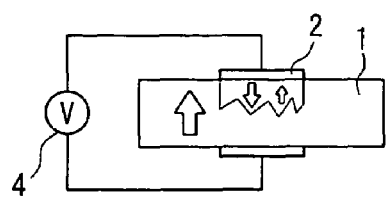
FIG. 2C is a diagram showing a polarization direction when a voltage is applied to a ferroelectric substrate.
Figure 2D:
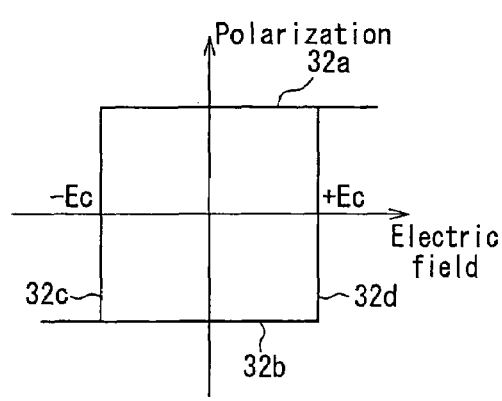
FIG. 2D shows the relationship between an electric field and polarization when a voltage is applied to a ferroelectric substrate, indicating the hysteresis characteristics.

Next, the reason that conductivity of the ferroelectric substrate 1 can be varied by controlling the polarization direction is described below. The following is an explanation of the ferroelectric characteristics. A ferroelectric material has spontaneous polarization, and the direction of the spontaneous polarization can be changed by an external electric field. FIGS. 2A, 2B, and 2C are diagrams illustrating the polarization directions when a voltage is applied to the ferroelectric substrate. FIG. 2D shows the relationship between an electric field and polarization when a voltage is applied to the ferroelectric substrate, indicating the hysteresis characteristics.

It is known that the ferroelectric substrate 1 exhibits the hysteresis characteristics as shown in FIG. 2D while an electric field is applied to the ferroelectric substrate 1 by the voltage source 4. The ferroelectric substrate 1 has a displacement of electric charge in the crystals, and an electric field is inside the ferroelectric substrate 1. This is called spontaneous polarization (Ps). The direction of the spontaneous polarization is changed by externally applying a voltage in the direction opposite to the internal electric field.

For example, a uniaxial crystal has polarization only in two directions. As shown in FIGS. 2A to 2C, the ferroelectric substrate 1 is sandwiched between the pair of electrodes 2, and the direction in which two electrodes face each other lies along the polarization directions that are indicated by the arrows in FIGS. 2A to 2C. First, the ferroelectric substrate 1 is polarized spontaneously in the absence of an electric field. The spontaneous polarization is directed upward in FIG. 2A. Then, an electric field is applied to the ferroelectric substrate 1 by the voltage source 4 in the direction opposite to the spontaneous polarization (i.e., downward in FIG. 2A). When the applied electric field exceeds a reverse electric field—Ec, the polarization direction is reversed by 180 degrees (i.e., Ps is changed to—Ps) in part of the ferroelectric substrate 1 near the pair of electrodes 2, resulting in the state of FIG. 2B. In FIGS. 2A to 2C, the upward direction is represented by "+" and the downward direction is represented by "−". Such a phenomenon in which the polarization direction is changed to its opposite (e.g., from FIG. 2A to FIG. 2B) is called a domain inversion. The state of FIG. 2A corresponds to a state 32a in FIG. 2D. When the applied electric field is—Ec, the state 32a is changed to a state 32b. There is a state 32c between the states 32a and 32b. While the ferroelectric substrate 1 is in the state 32b (FIG. 2B), a voltage is applied externally to the ferroelectric substrate 1 by the voltage source 4 in the direction opposite to the polarization (i.e., upward in FIG. 2B). In this case, the polarization direction is turned upward at the time the electric field exceeds Ec, as shown in FIG. 2A. That is, the state is changed from 32b to 32a via 32d in FIG. 2D.

In the state 32a of FIG. 2D, the ferroelectric substrate 1 retains its original crystalline state. In the state 32b, the spontaneous polarization of the ferroelectric substrate 1 is reversed between the pair of electrodes 2. Although the states 32a, 32b are stable, the states 32c, 32d have been considered transient and unstable in crystal structure because they are intermediate stages of the transition between the states 32a and 32b. As shown in FIG. 2C, the polarization of the ferroelectric substrate 1 near the pair of electrodes 2 is not reversed fully, but only partially. Thus, two polarization directions are included in the portion near the pair of electrodes 2: the downward direction of the reversed polarization and the upward direction of the spontaneous polarization. The spontaneous polarization is generated by the internal electric field.

Next, a change in current due to a change in polarization direction is described below. A ferroelectric generally is an insulator. However, in the vicinity of the reverse electric field Ec at which a domain inversion occurs, a current can flow instantaneously when the internal electric charge moves according to a reversal of the spontaneous polarization. The amount of electric charge for this current is proportional to a domain-inverted area S and expressed by 2 Ps×S. The domain inversion ends with the flow of the electric charge (2 Ps×S) that is required to reverse the polarization. Then, the current is stopped, and the ferroelectric returns to an insulator. In other words, a current flows only at the instant of the domain inversion, and the amount of the current is not much. For example, switching may be performed by using a current that flows instantaneously between the pair of electrodes 2 by the movement of the electric charge.

When a high voltage is applied to an insulator, a dielectric breakdown occurs to increase the electric conductivity of the insulator. This is a phenomenon in which the crystal structure is fractured by a high electric field, and the insulator loses its insulating properties. Such a fracture can change the crystal structure itself. Therefore, the phenomenon is irreversible.

Regarding ferroelectric crystals, the present inventors found another phenomenon of improving the electric conductivity of a ferroelectric material in addition to the dielectric breakdown. In this phenomenon, the electric conductivity was increased reversibly. Specifically, the uniaxial ferroelectric substrate 1 as described by referring to FIGS. 2A to 2D was considered to have the stable states 32a, 32b and the transient states 32c, 32d (FIG. 2D). However, the states 32c, 32d were present as a crystalline state of the ferroelectric substrate 1 in which the polarization was reversed in part of the crystals of the ferroelectric substrate 1, and the resistance of the crystals was decreased significantly. Such low resistance of the ferroelectric substrate 1 was observed only in the states 32c, 32d that were intermediate stages between the states 32a and 32b. The state 32c is illustrated in FIG. 2C. As can be seen from FIG. 2C, when a domain inversion occurred in part of the ferroelectric substrate 1 between the pair of electrodes 2, the resistance of the ferroelectric substrate 1 was decreased.

First, a Z plate of Mg-doped $LiNbO_3$ crystals was treated to have a single domain structure and used as a ferroelectric substrate 1. Then, an electric field (about 2.6 kV/mm) was applied in the direction opposite to the spontaneous polarization of the ferroelectric substrate 1. When the polarization was reversed in part of the crystals, the electric resistance of the crystals was decreased significantly. This ferroelectric substrate 1 was an insulator having an electric resistance of $10^{10}$ Ω·cm or more. However, the electric resistance was decreased to $10^6$ Ω·cm or less after a domain inversion started. The domain inversion proceeded by continuing the application of a voltage further. Upon completion of the domain inversion, the ferroelectric substrate 1 returned to the original insulator. Thus, the ferroelectric substrate 1 of Mg-doped $LiNbO_3$ crystals significantly decreased in resistance during the progress of the domain inversion. Moreover, when the ferroelectric substrate 1 with low resistance was heat-treated at about 200° C., the resistance was increased to nearly the value of the initial condition. In this case, the shape of the domain-inverted region was unchanged.

Another experiment was conducted in the following manner. AZ plate of Mg-doped $LiNbO_3$ crystals (the doping amount of Mg was 5 mol %) was treated to have a single domain structure and used as a ferroelectric substrate 1. Then, an electric field (about 4 kV/mm) was applied in the direction opposite to the spontaneous polarization of the ferroelectric substrate 1. Consequently, when the polarization was reversed in part of the crystals, the electric resistance of the ferroelectric substrate 1 was decreased significantly. The ferroelectric substrate 1 was an insulator having an electric resistance of 1 G Ω·cm or more. However, the electric resistance was decreased to 1 M Ω·cm or less after a domain inversion started. The resistance value was increased again by continuing the application of an electric field further.

Based on these results, the ferroelectric substrate including a metal such as Mg-doped LiNbO$_3$ crystals may decrease in resistance while retaining the internal electric field immediately after a domain inversion has started. In this case, the internal electric field remains in the crystals immediately after the beginning of a reversal of the spontaneous polarization and is opposite to the reversed polarization.

A decrease in resistance during the progress of a domain inversion is observed in the ferroelectric crystals such as LiNbO$_3$, LiTaO$_3$, and KTP. In such a low resistance state, the ferroelectric crystals have a distortion in the crystal structure caused by the domain inversion and retain the electric field opposite to the reversed polarization. Under these conditions, when an electric field is applied in the direction opposite to the reversed polarization, a reversion can occur at a lower voltage compared with the general reverse electric field Ec, so that the ferroelectric crystals return to the original state with the spontaneous polarization.

Figure 3:
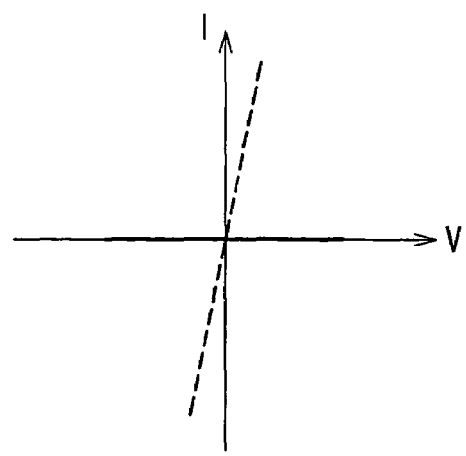
FIG. 3 shows the current and voltage properties for each of the states in FIGS. 2A and 2C.

FIG. 3 shows the current and voltage properties for each of the states in FIGS. 2A and 2C. In FIG. 3, the solid line indicates the state of FIG. 2A, and the broken line indicates the state of FIG. 2C. As shown in FIG. 3, when the ferroelectric substrate 1 is polarized fully (FIG. 2A), it acts as an insulator and conducts no current. However, when the ferroelectric substrate 1 is in the process of undergoing a domain inversion and retains the internal electric field opposite to the reversed spontaneous polarization (FIG. 2C), it has low resistance and conducts a current. In other words, the electric resistance of a ferroelectric can be decreased significantly if the following two requirements are met simultaneously: (a) the polarization has not been reversed fully between the electrodes; (b) the internal electric field is present opposite to the reversed polarization.

When the domain inversion is completed between the electrodes as shown in FIG. 2A or 2B, the electric resistance is increased again. It is desirable that the domain-inverted region is approximately 10% to 90% of the ferroelectric between the electrodes. The presence of the internal electric field also is important. As described above, when the ferroelectric with low resistance is heat-treated at about 200° C., the resistance is increased. This is attributed to a reduction in the internal electric field. Moreover, a decrease in resistance may result from a distortion of the crystal structure caused by the domain inversion, since the distortion of the crystal structure is responsible for the internal electric field, and the electric resistance is decreased in the presence of the internal electric field.

The low-resistance ferroelectric has about the same resistance value as a semiconductor, and also exhibits properties comparable to those of the semiconductor. Specifically, the ferroelectric has the rectification properties. For example, the current and voltage properties were evaluated by depositing a metal film on the ferroelectric. The result showed that the current and voltage properties varied significantly depending on the type of metal film. The reason for this may be that the state of a Schottky barrier at the contact between the metal and the semiconductor was changed, and thus the rectification properties were changed by the work function of the metal film. In other words, the ferroelectric that is polarized partially and has low resistance can exhibit the properties as a semiconductor.

As described above, it has been reported that an X plate of Mg-doped LiNbO$_3$ has the rectification properties and low resistance in the domain-inverted region. While the resistance is decreased in the domain-inverted region of the X plate of Mg-doped LiNbO$_3$, the ferroelectric substrate 1 of Embodiment 1 decreases in resistance by a domain inversion and the presence of the internal electric field due to the domain inversion. Accordingly, they differ from each other.

The electric switch of Embodiment 1 has two states: a state in which the ferroelectric substrate 1 has the internal electric field and the polarization opposite to it together (FIG. 2C); and a state in which the ferroelectric substrate 1 is polarized fully (FIG. 2A or 2B). The ferroelectric substrate 1 can be switched from one to another of these states, thereby making the resistance low or high. Thus, the electric switch is controlled to be conductive or nonconductive.

Figure 4A:
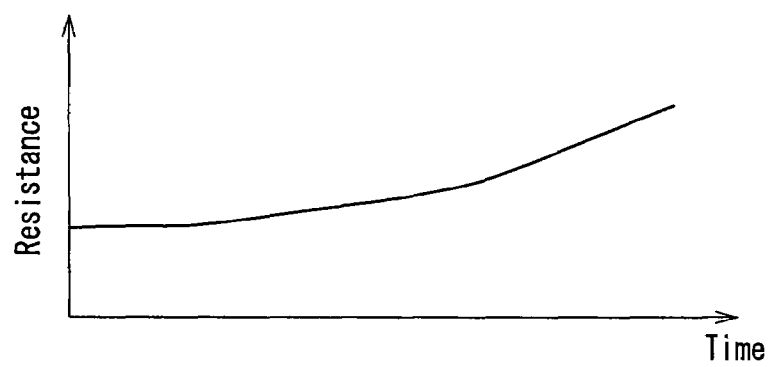
FIG. 4A is a graph plotting a change in resistance against time when a direct-current voltage is applied to a ferroelectric substrate.
Figure 4B:
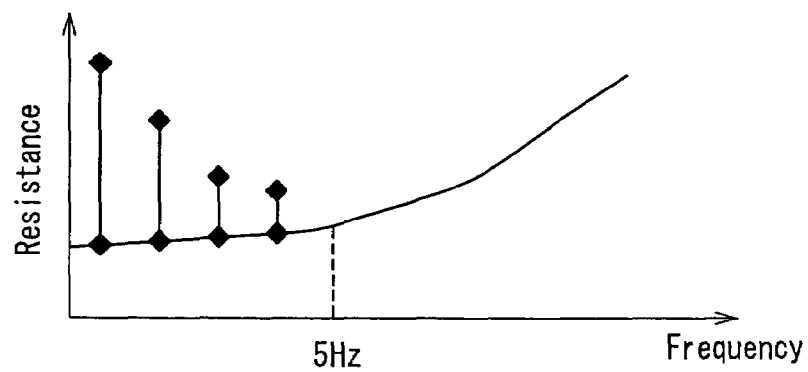
FIG. 4B is a graph plotting a change in resistance against frequency of a ferroelectric substrate.

However, the presence of the internal electric field may lead to an unstable crystal structure. Therefore, a change in resistance with time of the low-resistance ferroelectric substrate 1 was measured. FIG. 4A is a graph plotting a change in resistance against time when a direct-current voltage is applied to the ferroelectric substrate 1. The ferroelectric substrate 1 was in the state of FIG. 2C, and the temperature of the ferroelectric substrate 1 was 120° C. As shown in FIG. 4A, the resistance value was increased gradually with time and became two to three times during several hours. This indicates that the resistance of the domain-inverted region is increased with time. Such a change in resistance depends on temperature. Although the resistance change is considerably small at room temperature, it becomes two to three times at temperatures higher than 100° C. It is desirable that the ferroelectric substrate 1 is used at a temperature of 50° C. or less to ensure stability while avoiding a large change in resistance. Moreover, the frequency dependence of the resistance was measured. FIG. 4B is a graph plotting a change in resistance against frequency of the ferroelectric substrate 1. A high frequency was applied to the domain-inverted region of the ferroelectric substrate 1, and then the resistance was measured by the current and voltage properties. As shown in FIG. 4B, the resistance was increased with frequency. The resistance, which was about 1 MΩ for a direct current, was increased to about 3 MΩ at a frequency of 1 kHz. In view of the resistance change over time, however, a time-related change was eliminated mostly by increasing the frequency. FIG. 4B also shows the amount of change in resistance with time. As can be seen from FIG. 4B, the resistance value was increased with time at a direct-current voltage or an alternating current of less than 5 Hz. However, the resistance value was hardly changed with time and remained stable for an alternating current of 10 Hz or more. Thus, a signal used for controlling the switching of the electric switch may be an alternating-current signal of not less than 5 Hz, and more preferably not less than 10 Hz.

As described above, when the ferroelectric substrate 1 has low resistance by a domain inversion, the resistance depends on the frequency of a high-frequency electric field applied (FIG. 4B). Specifically, the resistance is increased with frequency. Moreover, when the low-resistance ferroelectric substrate 1 reverts to a high resistance state, a high current is required to flow during the application of an electric field. Therefore, an electric field on which a high frequency is superimposed may be applied. This can increase the resistance of the ferroelectric substrate 1 and lower the current during the application of an electric field. Thus, the driving power of the electric switch can be reduced.

Figure 5A:
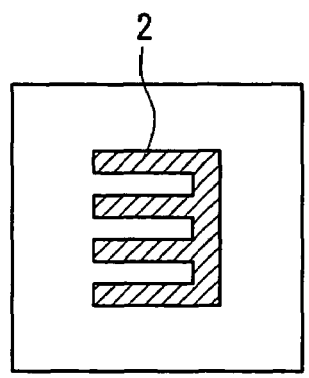
FIG. 5A is a plan view showing the shape of an electrode.
Figure 5B:
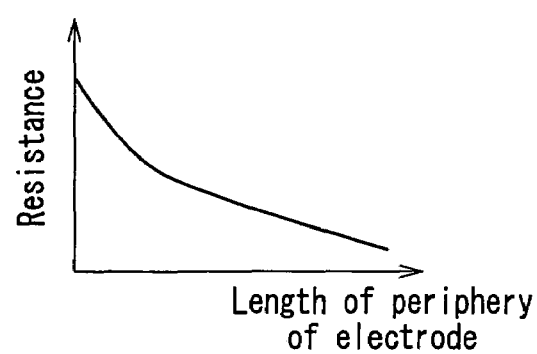
FIG. 5B shows the relationship between resistance and a length of the periphery of each of a pair of electrodes.

The resistance value of the low-resistance ferroelectric substrate 1 depends on the surface area where a domain inversion occurs. FIG. 5A is a plan view illustrating the shape of an electrode. As shown in FIG. 2A, the pair of electrodes 2 may be arranged along the direction of the polarization of the ferroelectric substrate 1. It is desirable that the pair of electrodes 2 are comb-shaped electrodes, as shown in FIG. 5A. Accordingly, the length of the periphery of the pair of electrodes 2 can be made longer. FIG. 5B shows the relationship between the resistance and the length of the periphery of each of the pair of electrodes 2. As shown in FIG. 5B, the resistance of the ferroelectric substrate 1 can be decreased further as the length of the periphery (electrode edge) of each of the pair of electrodes 2 becomes longer. In other words, if there are electrodes having the same area, the electrode with a shape that allows for a longer peripheral length can achieve even lower resistance. Therefore, the comb-shaped electrodes or the like may be used.

The pair of electrodes 2 may be formed, e.g. by using a branch-shaped electrode with electrode fingers on both ends thereof. The electrode direction is defined by aligning the electrode fingers with the Y-axis direction of the crystals to improve the properties. The experiment using a Z plate of Mg-doped $LiNbO_3$ showed that the ease of growth of a domain inversion differed depending on the direction of the electrode fingers. The rate of expansion of the domain inversion by the electrode fingers aligned with the Y-axis direction was at least 10 times faster than that by the electrode fingers formed in the X-axis direction (which is at right angles to the Y-axis direction). Therefore, the electrode fingers preferably are aligned with the Y-axis direction of the crystals.

The Mg-doped $LiNbO_3$ was used as the ferroelectric substrate 1 because a similar effect was not obtained by a $LiNbO_3$ crystal. The $LiNbO_3$ crystal itself did not considerably improve the electric conductivity due to a domain inversion, and the insulating properties were unchanged. That is, when a metal is added to the ferroelectric, the electric conductivity can be varied with the polarization direction. Similarly, a $LiTaO_3$ crystal alone did not change in electric conductivity before and after a domain inversion. Although both $LiNbO_3$ and $LiTaO_3$ were insulators, the electric conductivity was varied by adding a metal additive such as Mg. When the doping amount of Mg was less than 1 mol %, the resistance change of the ferroelectric substrate 1 caused by changing the polarization direction was decreased significantly to about several %. At least 1 mol % of metal should be added to make a large resistance change of 10% or more. The addition of 3 mol % or more of metal is effective because the resistance is decreased to one-tenth or less. For other ferroelectric materials, the electric conductivity may be varied in the same manner as long as the doping amount of metal is increased.

The ferroelectric substrate 1 may be formed of a material other than a single domain ferroelectric crystal. For example, a material including crystal grains such as amorphous crystals or microcrystals can have a similar effect. An amorphous or microcrystalline structure can use a thin film material and does not require crystal growth of the bulk, which facilitates the fabrication of a device. Moreover, the amorphous or microcrystalline structure can increase the doping amount of metal additive. Therefore, the amount of change in electric resistance can be increased between the pair of electrodes 2. However, a lattice distortion of the crystals increases with increasing the doping amount of metal. This may cause cracks or the like when a large crystal is pulled up, and makes it difficult to ensure uniform growth of the large crystal. For example, it is difficult to add 10 mol % or more of Mg to $LiNbO_3$. Thus, the doping amount is preferably 10 mol % or less for a single crystal substrate.

In this embodiment, $MgO:LiNbO_3$ having the spontaneous polarization of a single domain is used as the ferroelectric substrate 1. However, ferroelectrics, e.g., $LiNbO_3$, $LiTaO_3$, or KTP doped with other metals such as In, SC, Cu, and Fe, or a mixed crystal of any of these crystals also can provide a similar effect.

In addition to the Z-plate substrate whose spontaneous polarization is oriented perpendicular to the surface, the materials used for the ferroelectric substrate 1 may be, e.g., an X or Y plate whose spontaneous polarization is oriented parallel to the substrate plane, or an off-cut substrate in which the direction of the spontaneous polarization obliquely crosses the substrate surface. The off-cut substrate is more preferred because of its high conformability of polarization and good reproducibility of a uniform domain inversion.

As described above, a change in electric resistance of the ferroelectric was observed near room temperature, and the electric resistance was decreased significantly. This suggests the possibility that the ferroelectric can bring about superconducting action at even lower temperatures. The ferroelectric was unstable in crystal structure at high temperatures and also was under time constraints. However, the crystal instability can be removed by using the ferroelectric at low temperatures. If the ferroelectric is used at a low temperature of 0° C. or less, it can exhibit superconductivity and form a superconducting electric switch by utilizing a domain inversion.

EMBODIMENT 2

Electric switches in Embodiment 2 of the present invention will be described with reference to the drawings. Like Embodiment 1, the electric switches of Embodiment 2 control the polarization of a ferroelectric substrate to which a metal is added, thereby changing the resistance of the ferroelectric substrate. Thus, the ferroelectric substrate can be electrically conductive or nonconductive. Although the arrangement of electrodes and the configuration of an electric field applying portion are different, the ferroelectric substrate used in this embodiment may be the same as Embodiment 1.

Figure 6A:
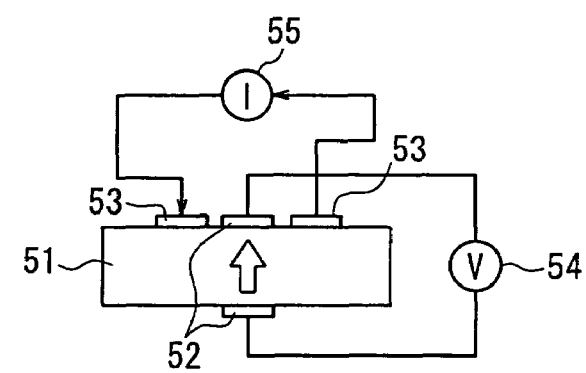
FIG. 6A is a side view showing the configuration of a first electric switch in Embodiment 2.
Figure 6B:
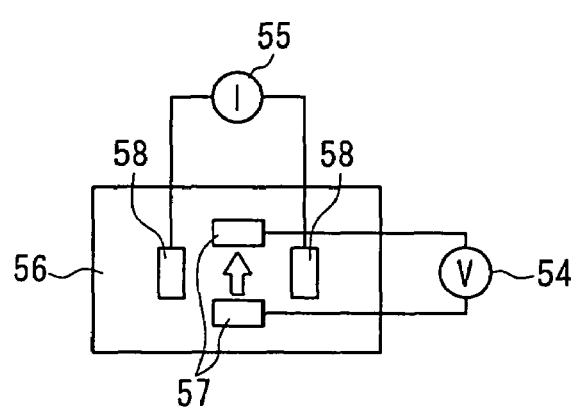
FIG. 6B is a plan view showing the configuration of a second electric switch in Embodiment 2.

FIGS. 6A and 6B show the configurations of electric switches in Embodiment 2. FIG. 6A is a side view showing the configuration of a first electric switch. A pair of voltage electrodes 52 is provided along the direction of the spontaneous polarization of a ferroelectric substrate 51, as indicated by the arrow in FIG. 6A. The ferroelectric substrate 51 is sandwiched between the pair of voltage electrodes 52 with one electrode being placed on the surface, and the other electrode being placed on the back. Moreover, a pair of current electrodes 53 is provided on either of the surfaces of the ferroelectric substrate 51, on which the pair of voltage electrodes 52 is formed. The pair of current electrodes 53 is arranged perpendicular to the direction of the spontaneous polarization. FIG. 6B is a plan view showing the configuration of a second electric switch. A pair of voltage electrodes 57 is provided on one surface of a ferroelectric substrate 56 along the direction of the spontaneous polarization of the ferroelectric substrate 56, as indicated by the arrow in FIG. 6B. Moreover, a pair of current electrodes 58 is placed in the same plane of the ferroelectric substrate 56 as the pair of voltage electrodes 57. The pair of current electrodes 58 is arranged perpendicular to the direction of the spontaneous polarization. In FIGS. 6A and 6B, the pairs of voltage electrodes 52, 57 are connected electrically to a voltage source 54, and the pairs of current electrodes 53, 58 are connected electrically to a current source 55. The ferroelectric substrate 51 in FIG. 6A may be a Z plate, and the ferroelectric substrate 56 in FIG. 6B may be an X or Y plate. An off-cut substrate also can be used in FIGS. 6A and 6B.

In the electric switches of FIGS. 6A and 6B, an electric field in the opposite direction to the spontaneous polarization of the ferroelectric substrates 51, 56 or an electric field in the same direction as the spontaneous polarization is applied selectively between the pair of voltage electrodes 52 and between the pair of voltage electrodes 57 by using the voltage sources 54, respectively. The selective application of an electric field can control the resistance between each of the pairs of voltage electrodes 52, 57 to be high or low resistance. Thus, the resistance between each of the pairs of current electrodes 53, 58 also is controlled to be low or high resistance, allowing a current to flow or not to flow.

Figure 7A:
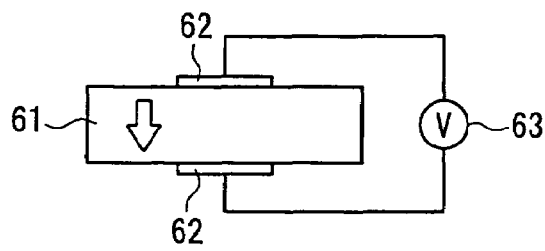
FIG. 7A is a side view showing the configuration of a third electric switch in Embodiment 2.

FIG. 7A is a side view showing the configuration of a third electric switch in Embodiment 2. The electric switch of FIG. 7A switches a current value between a pair of electrodes 62. The pair of electrodes 62 is placed respectively on the surface and back of a ferroelectric substrate 61, and arranged along the direction of the polarization of the ferroelectric substrate 61. The pair of electrodes 62 is connected electrically to a voltage source 63.

Figure 7B:
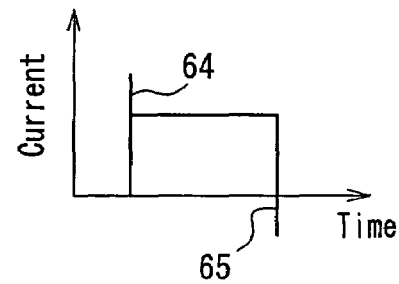
FIG. 7B shows the relationship between time and a current flowing between a pair of electrodes.

The electric field applied between the pair of electrodes 62 by the voltage source 63 is a pulse electric field greater than the reverse electric field Ec. The application of the electric field reverses the polarization in part of the ferroelectric substrate 61 between the pair of electrodes 62, and thus decreases the electric resistance of the ferroelectric substrate 61. FIG. 7B shows the relationship between time and a current flowing between the pair of electrodes 62. In FIG. 7B, a protruding portion 64 indicates a current at the time the pulse electric field is applied. The resistance of the ferroelectric substrate 61 is decreased by applying the pulse electric field, so that a current flows between the pair of electrodes 62, as shown in FIG. 7B. Moreover, when a negative pulse voltage is applied, the current is stopped. In FIG. 7B, a protruding portion 65 indicates a current at the time the negative pulse voltage is applied. Thus, the current value can be varied by superimposing the pulse voltage on the current, and switching can be performed.

Figure 8A:
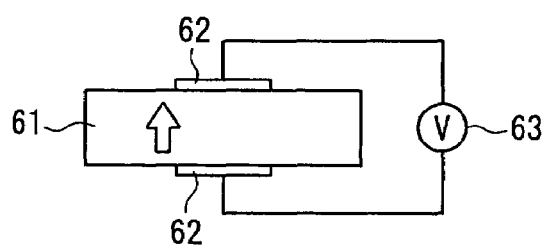
FIG. 8A is a side view showing the configuration of a fourth electric switch in Embodiment 2.
Figure 8B:
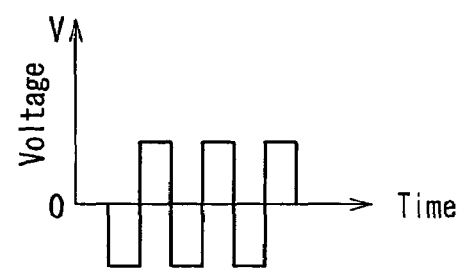
FIG. 8B shows the relationship between time and a voltage applied to a ferroelectric substrate of the fourth electric switch in Embodiment 2.
Figure 8C:
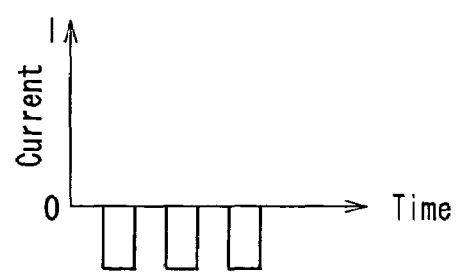
FIG. 8C shows the relationship between time and a current flowing through the fourth electric switch in Embodiment 2.

FIG. 8A is a side view showing the configuration of a fourth electric switch in Embodiment 2. This electric switch has the same configuration as the electric switch of FIG. 7A except that the direction of polarization (indicated by the arrow in FIG. 8A) differs by 180 degrees. The voltage source 63 applies a pulse voltage to the ferroelectric substrate 61 so that the pulse voltage becomes alternately positive and negative. FIG. 8B shows the relationship between time and a voltage applied to the ferroelectric substrate of the fourth electric switch. FIG. 8C shows the relationship between time and a current flowing through the fourth electric switch. The current waveform of FIG. 8C can be obtained by applying the pulse voltage of FIG. 8B between the pair of electrodes 62. This makes it clear that the fourth electric switch acts as a rectifying element. When the pulse voltage applied by the voltage source 63 is "−", a domain inversion occurs and a current flows. When the pulse voltage is changed to "+", the domain inversion disappears and the current no longer flows. The rectification properties can be provided by repeating these operations. Although the reverse electric field Ec (2.6 kV/mm) is required for the domain inversion, the domain-inverted region can revert to the original state only by applying an electric field of 0.5 kV/mm or less. This is because the reverse voltage is reduced in the presence of the internal electric field.

EMBODIMENT 3

Electric switches in Embodiment 3 of the present invention will be described with reference to the drawings.

As described in Embodiment 1, the electric conductivity of a ferroelectric material can be increased reversibly due to a reversal of the spontaneous polarization, and this phenomenon may be affected by the internal voltage. However, the presence or absence of a domain wall also can contribute to the phenomenon. The domain wall is a boundary between regions with different polarization directions. The electric resistance of a ferroelectric substrate is changed significantly depending on the presence or absence of a domain wall. In the early stages of applying an electric field to the ferroelectric substrate, the electric resistance may be decreased significantly because a domain wall is present between the electrodes. While the application of an electric field is continued, the domain-inverted region expands further. After the domain inversion is completed, the domain-inverted region becomes larger than the electrode area. Since the domain wall is away from the electrodes, the resistance between the electrodes may be increased again.

The possible causes of this phenomenon are that the crystal structure is distorted considerably in the domain wall, and there is a large internal electric field in a region where the spontaneous polarization is changed rapidly. In Embodiment 3, therefore, the electric switches will be described along with the domain wall.

Figure 9A:
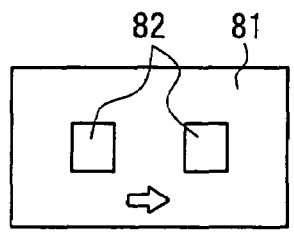
FIG. 9A is a plan view showing the configuration of an electric switch in Embodiment 3 of the present invention.
Figure 9B:
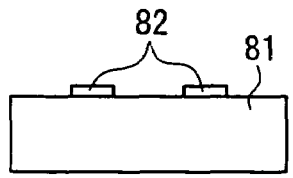
FIG. 9B is a cross-sectional view showing the configuration of the electric switch in Embodiment 3 of the present invention.
Figure 9C:
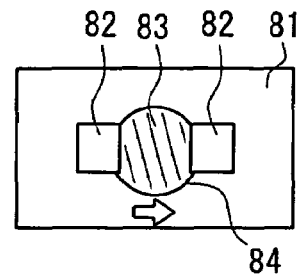
FIG. 9C is a plan view showing the configuration of the electric switch tin Embodiment 3, in which a domain wall is generated.
Figure 9D:
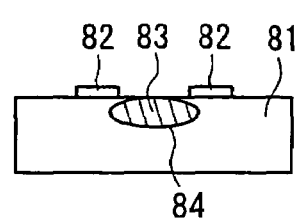
FIG. 9D is a cross-sectional view showing the configuration of the electric switch in Embodiment 3, in which a domain wall is generated.

FIGS. 9A to 9D show the configuration of an electric switch in Embodiment 3. FIG. 9A is a plan view of the configuration of the electric switch. FIG. 9B is a cross-sectional view of the configuration of the electric switch. FIG. 9C is a plan view of the configuration of the electric switch in which a domain wall is generated. FIG. 9D is a cross-sectional view of the configuration of the electric switch in which a domain wall is generated. In FIGS. 9A to 9D, a pair of electrodes 82 is formed on the surface of a ferroelectric substrate 81. The ferroelectric substrate 81 may be the same as the ferroelectric substrates used in Embodiments 1 and 2, and has a similar effect. The direction of the spontaneous polarization of the ferroelectric substrate 81 is indicated by the arrow in the drawings. The pair of electrodes 82 is arranged side-by-side along the direction of the spontaneous polarization. As shown in FIGS. 9A and 9B, when the spontaneous polarization is not changed, a region having polarization in a different direction is not formed between the pair of electrodes 82 and neither is a domain wall. In this state, the ferroelectric substrate 81 has high resistance and conducts no current between the pair of electrodes 82. When the direction of the spontaneous polarization of the ferroelectric substrate 81 is changed by an electric field applying portion, a region 83 having polarization in a different direction is generated between the pair of electrodes 82, as shown in FIGS. 9C and 9D. The direction of the polarization inside the region 83 differs from that of the polarization outside the region 83. The boundary between these two regions that differ in polarization direction is a domain wall 84. The electric resistance is decreased significantly at the domain wall 84, and therefore the resistance between the pair of electrodes 82 is low. Thus, a current can flow between the pair of electrodes 82.

The electric field applying portion (not shown) may be, e.g., a voltage source that can apply an electric field to the ferroelectric substrate either in the direction of the spontaneous polarization or in the opposite direction, as described in Embodiments 1 and 2. Alternatively, it may be, e.g., a voltage source for applying a voltage between the pair of electrodes 82. As described above, the domain wall 84 can be generated by applying a voltage between the pair of electrodes 82 in the direction opposite to the spontaneous polarization, so that the resistance between the pair of electors 82 can be changed.

The polarization direction of the region 83 varies depending on the ferroelectric substrate 81. For example, when a single domain MgO:Limbo$_3$ is used as the ferroelectric substrate 81, the polarization direction is turned by 180 degrees due to a domain inversion. Therefore, the polarization direction of the region 83 differs by 180 degrees from that of the ferroelectric substrate 81. In addition to the 180° difference, the polarization direction may be parallel, perpendicular, or inclined to the surface of the ferroelectric substrate 81. Moreover, there may be a plurality of directions in which the polarization is stable. In such a case, the polarization direction is determined by the direction of an electric field to be applied.

The ferroelectric substrate 81 is a single domain crystal. However, if the ferroelectric substrate 81 is not polarized uniformly in one direction, it should be treated to have a single domain structure. As the ferroelectric substrate 81, e.g., microcrystalline, amorphous or ceramic materials, a single crystal, and a thin film crystal obtained by liquid-phase growth can be used. However, these materials have polarization in random directions. Therefore, it is desirable to perform a poling process. In the poling process, the temperature of each material is raised near the Curie temperature of the crystals, and then an electric field is applied so that the polarization is aligned in one direction. Since the spontaneous polarization is produced after raising the temperature, a crystal distortion is not likely to remain in the domain wall 84. Subsequently, the material is cooled gradually. Thus, from a macroscopic view, the ferroelectric substrate 81 can be formed with the polarization direction being aligned.

To achieve a low resistance state of the ferroelectric substrate 81 that has been subjected to the poling process, it is desirable to apply an electric field in the direction opposite to the poling electric field while maintaining the temperature of the ferroelectric substrate 81 much lower than the Curie temperature. The Curie temperature is usually several hundreds of degrees centigrade. Therefore, the domain inversion temperature is preferably one-half or less of the Curie temperature or not more than 100° C. This can produce a state in which the crystal distortion remains in the domain wall by a domain inversion.

Referring to FIGS. 9A to 9D, an example that uses Mg-doped LiNbO$_3$ as the ferroelectric substrate 81 is described below. The doping amount of Mg is 5 mol %. The ferroelectric substrate 81 is an X-cut substrate of a single domain crystal and has spontaneous polarization in a direction along which the pair of electrodes 82 is arranged. In the state of FIGS. 9A and 9B, an electric field of 5 kV/mm was applied between the pair of electrodes 82 by an electric field applying portion (not shown) in the direction opposite to the spontaneous polarization. For example, when a distance between the pair of electrodes 82 was 1 μm, the applied voltage was 5V. A domain wall was generated by applying the voltage. Accordingly, the state was changed to that of FIGS. 9C and 9D. In this case, the resistance between the pair of electrodes 82 was several hundreds of ohms.

Next, a voltage (e.g., 5V) was applied in the direction opposite to the previous voltage application. Then, the state again returned to that of FIGS. 9A and 9B, and the resistance between the pair of electrodes 82 was increased to several tens of kilohms. The rate of change in resistance was double figures, i.e., 100 times or more.

The above operation of applying an electric field was repeated, and the resistance between the pair of electrodes 82 was changed in the same manner. The resistance values immediately after the transition between the state of FIGS. 9A and 9B and the state of FIGS. 9C and 9D varied slightly. Thereafter, the resistance values in each of the states were stable and kept constant over several months. Thus, the polarization of the ferroelectric substrate 81 is very stable, so that the electric switch in Embodiment 3 can maintain the switching states semipermanently without requiring an external electric supply during that period.

When the direction of the polarization of the ferroelectric substrate 81 is changed, the domain wall 84 is formed or removed. This can cause a large crystal distortion in a portion where the domain wall 84 is generated. Therefore, crystal damage is left in the ferroelectric substrate 81 as the number of repeated switching operations is increased. The crystal damage depends on the size of a region of the domain wall 84, and the limits on the number of repeated switching operations are reduced with an increase in the area of the domain wall 84. When the area of the domain wall 84 was 1 mm$^2$ or more, the number of repeated switching operations was about 1000. To perform the switching operations 100,000 times or more, the area of the domain wall 84 may be controlled to 100 μm$^2$ or less. Moreover, the number of repeated switching operations can be increased further by reducing the area of the domain wall 84 to 10 μm$^2$ or less.

As described above, the ferroelectric substrate 81 is doped with Mg. Such a metal additive is effective to reduce the value of the reverse electric field Ec for reversing the spontaneous polarization. For example, the reverse electric field Ec for a LiNbO$_3$ single crystal is about 20 kV/mm. previous voltage application. Then, the state again returned to that of FIGS. 9A and 9B, and the resistance between the pair of electrodes 82 was increased to several tens of kilohms. The rate of change in resistance was double figures, i.e., 100 times or more.

The above operation of applying an electric field was repeated, and the resistance between the pair of electrodes 82 was changed in the same manner. The resistance values immediately after the transition between the state of FIGS. 9A and 9B and the state of FIGS. 9C and 9D varied slightly. Thereafter, the resistance values in each of the states were stable and kept constant over several months. Thus, the polarization of the ferroelectric substrate 81 is very stable, so that the electric switch in Embodiment 3 can maintain the switching states semipermanently without requiring an external electric supply during that period.

When the direction of the polarization of the ferroelectric substrate 81 is changed, the domain wall 84 is formed or removed. This can cause a large crystal distortion in a portion where the domain wall 84 is generated. Therefore, crystal damage is left in the ferroelectric substrate 81 as the number of repeated switching operations is increased. The crystal damage depends on the size of a region of the domain wall 84, and the limits on the number of repeated switching operations are reduced with an increase in the area of the domain wall 84. When the area of the domain wall 84 was 1 mm$^2$ or more, the number of repeated switching operations was about 1000. To perform the switching operations 100,000 times or more, the area of the domain wall 84 may be controlled to 100 μm² or less. Moreover, the number of repeated switching operations can be increased further by reducing the area of the domain wall 84 to 10 μm² or less.

As described above, the ferroelectric substrate 81 is doped with Mg. Such a metal additive is effective to reduce the value of the reverse electric field Ec for reversing the spontaneous polarization. For example, the reverse electric field Ec for a LiNbO₃ single crystal is about 20 kV/mm. However, the reverse electric field Ec is reduced approximately to a quarter by doping the LiNbO₃ single crystal with about 5 mol % of Mg. When a voltage is applied to the crystal, it is distorted due to an electrostriction effect. Therefore, the crystal may cause cracks or the like by repeating the application of a high voltage. Thus, the life of the electric switch can be longer as the applied voltage to the ferroelectric substrate 81 is smaller. The addition of metal is advantageous in both reducing the applied voltage significantly and increasing the number of repeated switching operations of the electric switch.

The value of the reverse electric field Ec significantly depends on the crystal structure. To improve the efficiency of a crystal pulling process, a crystal having a congruent composition that deviates slightly from a perfect composition ratio is pulled up generally for use as the ferroelectric substrate 81. With the congruent composition, it becomes easier to pull up a uniform crystal. On the other hand, a crystal having a stoichiometric composition is known to reduce the value of the reverse electric field Ec significantly. With the stoichiometric composition, the defect density in the crystal is smaller, and thus the spontaneous polarization can be controlled easily. In the case of LiNbO₃ or LiTaO₃, the value of the reverse electric field Ec is reduced to nearly one-fourth to one-tenth. Therefore, the use of a stoichiometric crystal for the ferroelectric substrate 81 can reduce the applied voltage and increase the life of the electric switch significantly. The crystal having the stoichiometric composition can be produced easily by deposition using epitaxial growth in addition to the crystal pulling process. When an epitaxial growth film is used as the ferroelectric substrate 81, the reverse electric field Ec can be reduced easily, resulting in a longer switching life of the electric switch.

In Embodiment 3, the pair of electrodes 82 is formed on the surface of the ferroelectric substrate 81. However, the arrangement of the pair of electrodes 82 is not limited thereto. For example, the ferroelectric substrate 81 may be formed in a smaller thickness, and the pair of electrodes 82 may be placed respectively on the surface and back of the ferroelectric substrate 81. This configuration also can provide a similar effect. The resistance of the ferroelectric substrate 81 is low in the domain wall portion. Therefore, the resistance can be decreased by increasing the area of the domain wall. For example, the pair of electrodes 82 may be comb-shaped electrodes or the like, thereby achieving a larger area of the domain wall and lower resistance of the ferroelectric substrate 81.

Figure 10:
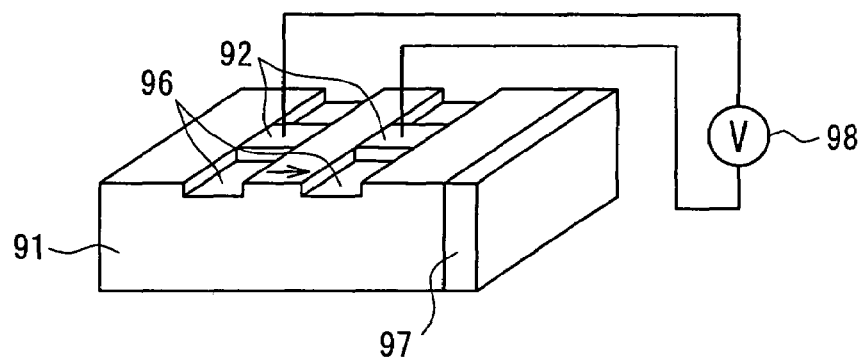
FIG. 10 is a diagram showing the configuration of another electric switch in Embodiment 3.

FIG. 10 is a diagram showing the configuration of another electric switch in Embodiment 3. A ferroelectric substrate 91 may be the same as the above ferroelectric substrate. Grooves (trenches) 96 are formed in the surface of the ferroelectric substrate 91, and a pair of electrodes 92 is provided in the grooves 96. Moreover, a heater (heating portion) 97 is provided on the ferroelectric substrate 91. The pair of electrodes 92 is connected to a voltage source (electric field applying portion) 98. The direction of the spontaneous polarization of the ferroelectric substrate 91 is indicated by the arrow in FIG. 10. The operation of this electric switch is the same as that of the above electric switch.

In the electric switch of FIG. 10, when the voltage source 98 applies an electric field between the pair of electrodes 92, it is desirable that the temperature of the ferroelectric substrate 91 is raised slightly above room temperature. The ferroelectric substrate 91 has a temperature of about 80° C. by using the heater 97, so that the applied electric field Ec for reversing the polarization can be reduced approximately by half. Such a reduction in the applied electric field Ec allows the electric switch to be driven with low power consumption. Moreover, a crystal distortion caused by a domain inversion is reduced, and the electric switch greatly can enhance resistance to repeated switching operations. Specifically, the ferroelectric substrate 91 is used preferably at not less than 20° C., and more preferably at not less than 40° C.

By forming the pair of electrodes 92 in the grooves 96, the electric field distribution becomes uniform, and thus reduces a voltage for generating a region having polarization in a different direction. Moreover, the influence of surface charge can be reduced to enhance the insulating properties between the pair of electrodes 92. The pair of electrodes 92 may be formed with one electrode being placed in any of the grooves 96 and the other electrode being placed on the surface of the ferroelectric substrate 91.

The ferroelectric substrates 81, 91 in Embodiment 3 also may have an amorphous or microcrystalline structure. With these structures, it is possible to increase the doping amount of metal. Moreover, a material such as ceramic obtained by sintering microcrystals also can provide similar properties. In this case, the boundary of regions that differ from each other in polarization direction needs to be present in the thin film to form the domain wall 84. Therefore, the thin film should include crystal grains having a predetermined size or more. For microcrystals, the grain size may be 1 μm or more. The thin film preferably has a thickness of 1 μm to 100 μm. When the thickness is extremely larger than these values, the deposition takes a long time, and mass production is difficult. Moreover, cracks or the like may be caused, e.g., by stress in a substrate on which the thin film is formed.

EMBODIMENT 4

Electric switches in Embodiment 4 of the present invention will be described with reference to the drawings. The electric switches of Embodiment 4 further include an electrode for forming and removing a domain wall in addition to the configuration of the electric switches of Embodiment 3. In the drawings of this embodiment, the identical elements to those in Embodiment 3 are denoted by the same reference numerals, and the explanation will not be repeated. As shown in FIGS. 9A to 9D, the electric switch operates by controlling the presence or absence of a domain wall between the pair of electrodes. The spontaneous polarization of a ferroelectric can be controlled by the application of an electric field.

Figure 11A:
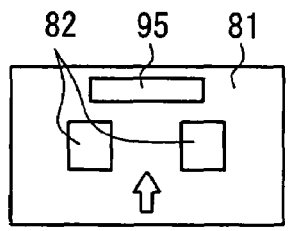
FIG. 11A is a plan view showing the configuration of a first electric switch in Embodiment 4 of the present invention.
Figure 11C:
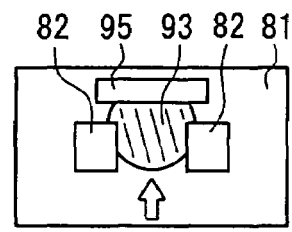
FIG. 11C is a plan view showing the configuration of the first electric switch in Embodiment 4, in which a domain wall is generated.
Figure 11B:
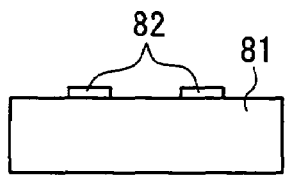
FIG. 11B is a cross-sectional view showing the configuration of the first electric switch in Embodiment 4 of the present invention.
Figure 11D:
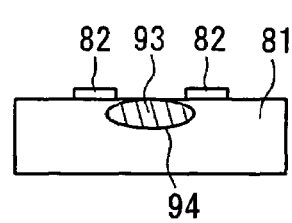
FIG. 11D is a cross-sectional view showing the configuration of the first electric switch in Embodiment 4, in which a domain wall is generated.

FIGS. 11A to 11D show the configuration of a first electric switch in Embodiment 4. FIG. 11A is a plan view of the configuration of the electric switch. FIG. 11B is a cross-sectional view of the configuration of the electric switch. FIG. 11C is a plan view of the configuration of the electric switch in which a domain wall is generated. FIG. 11D is a cross-sectional view of the configuration of the electric switch in which a domain wall is generated. The first electric switch includes a ferroelectric substrate 81, a pair of electrodes 82 formed on the surface of the ferroelectric substrate 81, and a polarizing electrode 95. A ferroelectric substrate having the properties as described in Embodiments 1 to 3 may be used as the ferroelectric substrate 81. The direction of the spontaneous polarization of the ferroelectric substrate 81 is indicated by the arrow in the drawings. The pair of electrodes 82 is placed in the same plane of the ferroelectric substrate 81 and arranged side-by-side perpendicular to the direction of the spontaneous polarization. The polarizing electrode 95 is provided with its longitudinal direction parallel to the direction in which the pair of electrodes 82 is arranged. In this electric switch, when an electric field is applied between the pair of electrodes 82 and the polarizing electrode 95, a region 93 having polarization in a different direction is generated, as shown in FIGS. 11C and 11D. The pair of electrodes 82 has the same electric potential. A domain wall 94 is formed around the region 93, thereby decreasing the resistance between the pair of electrodes 82. In the state of FIGS. 11A and 11B, no current flows between the pair of electrodes 82 (nonconductive) because the resistance is high. However, a current can flow between the pair of electrodes 82 (conductive) by changing the state to that of FIGS. 11C and 11D. Thus, the ferroelectric substrate 81 can act as a switch. Subsequently, in the state of FIGS. 11C and 11D, a voltage is applied between the pair of electrodes 82 and the polarizing electrode 95 in the direction opposite to the previous application of the electric field, which has decreased the resistance between the pair of electrodes 82. Then, the region 93 disappears and the domain wall 94 is removed, so that the resistance between the pair of electrodes 82 is increased and returns to the original state.

Figure 12A:
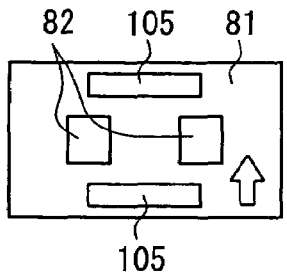
FIG. 12A is a plan view showing the configuration of a second electric switch in Embodiment 4 of the present invention.
Figure 12C:
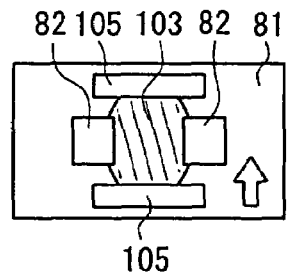
FIG. 12C is a plan view showing the configuration of the second electric switch in Embodiment 4, in which a domain wall is generated.
Figure 12B:
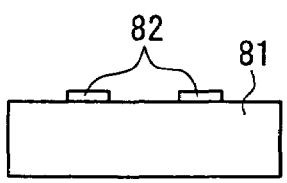
FIG. 12B is a cross-sectional view showing the configuration of the second electric switch in Embodiment 4 of the present invention.
Figure 12D:
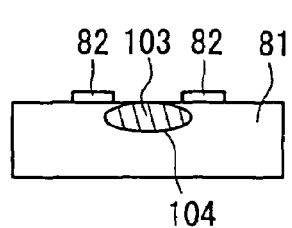
FIG. 12D is a cross-sectional view showing the configuration of the second electric switch in Embodiment 4, in which a domain wall is generated.

The following is an explanation of other electric switches. The principle of operation is the same as described above, i.e., the resistance between the pair of electrodes is decreased (conductive) by forming a domain wall and is increased (nonconductive) by removing the domain wall. FIGS. 12A to 12D show the configuration of a second electric switch in Embodiment 4. FIG. 12A is a plan view of the configuration of the electric switch. FIG. 12B is a cross-sectional view of the configuration of the electric switch. FIG. 12C is a plan view of the configuration of the electric switch in which a domain wall is generated. FIG. 12D is a cross-sectional view of the configuration of the electric switch in which a domain wall is generated. The second electric switch includes a ferroelectric substrate 81, a pair of electrodes 82 formed on the surface of the ferroelectric substrate 81, and a pair of polarizing electrodes 105. The direction of the spontaneous polarization of the ferroelectric substrate 81 is indicated by the arrow in the drawings. The pair of electrodes 82 is placed in the same plane of the ferroelectric substrate 81 and arranged side-by-side perpendicular to the direction of the spontaneous polarization. Each of the pair of polarizing electrodes 105 is provided with its longitudinal direction parallel to the direction in which the pair of electrodes 82 is arranged. The pair of polarizing electrodes 105 is arranged so as to sandwich the pair of electrodes 82. In other words, the two directions of arrangement of the pair of electrodes 82 and the pair of polarizing electrodes 105 cross at right angles. When an electric field is applied between the pair of polarizing electrodes 105, a region 103 having polarization in a different direction is generated, as shown in FIGS. 12C and 12D. A domain wall 104 is formed around the region 103, thereby decreasing the resistance between the pair of electrodes 82. In the state of FIGS. 12A and 12B, the resistance between the pair of electrodes 82 is high. Therefore, the ferroelectric substrate 81 can function as a switch by selectively switching between the two states. In this case, it is desirable that the direction of the spontaneous polarization of the ferroelectric substrate 81 is substantially parallel to the direction of the electric field produced between the pair of polarizing electrodes 105. Thus, the electric field for controlling the direction of the spontaneous polarization of the ferroelectric substrate 81 can be made smaller.

The state of FIGS. 12A and 12B is changed to that of FIGS. 12C and 12D by applying an electric field between the pair of polarizing electrodes 105. In this case, since the domain wall 104 is not formed, the ferroelectric substrate 81 has high resistance, and the electric field is applied easily. However, when the state of FIGS. 12C and 12D is changed to that of FIGS. 12A and 12B, the domain wall 104 is present between the pair of polarizing electrodes 105. Therefore, the ferroelectric substrate 81 has low resistance and is likely to conduct a current. Consequently, a large electric power is consumed during the application of an electric field. This can be avoided effectively, e.g., by forming an insulating film between the ferroelectric substrate 81 and each of the pair of polarizing electrodes 105. For example, an insulating film of $SiO_2$ or the like may be deposited between the ferroelectric substrate 81 and each of the pair of polarizing electrodes 105, thus preventing the flow of a current and significantly reducing power consumption in controlling the polarization.

Figure 13A:
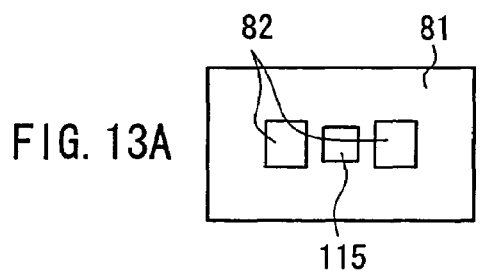
FIG. 13A is a plan view showing the configuration of a third electric switch in Embodiment 4 of the present invention.
Figure 13C:
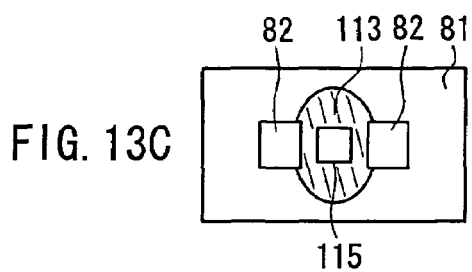
FIG. 13C is a plan view showing the configuration of the third electric switch in Embodiment 4, in which a domain wall is generated.
Figure 13B:
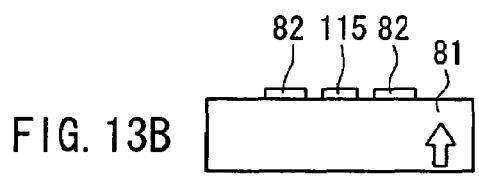
FIG. 13B is a cross-sectional view showing the configuration of the third electric switch in Embodiment 4 of the present invention.
Figure 13D:
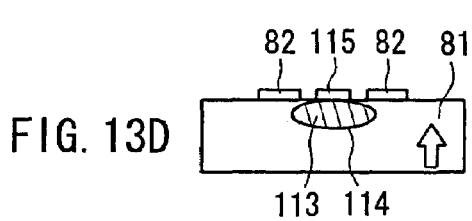
FIG. 13D is a cross-sectional view showing the configuration of the third electric switch in Embodiment 4, in which a domain wall is generated.

FIGS. 13A to 13D show the configuration of a third electric switch in Embodiment 4. FIG. 13A is a plan view of the configuration of the electric switch. FIG. 13B is a cross-sectional view of the configuration of the electric switch. FIG. 13C is a plan view of the configuration of the electric switch in which a domain wall is generated. FIG. 13D is a cross-sectional view of the configuration of the electric switch in which a domain wall is generated. The third electric switch includes a ferroelectric substrate 81, a pair of electrodes 82 formed on the surface of the ferroelectric substrate 81, and a polarizing electrode 115. The direction of the spontaneous polarization of the ferroelectric substrate 81 agrees with the thickness direction of the ferroelectric substrate 81, as indicated by the arrow in the drawings. The pair of electrodes 82 is placed in the same plane of the ferroelectric substrate 81 and arranged side-by-side. The polarizing electrode 115 is arranged between the pair of electrodes 82. While the first and second electric switches control the polarization in a direction parallel to the surface of the ferroelectric substrate 81, the third electric switch controls the spontaneous polarization in a direction perpendicular to the surface of the ferroelectric substrate 81. In FIGS. 13A and 13B, when a voltage is applied between the pair of electrodes 82 and the polarizing electrode 115, an electric field also is produced in the direction perpendicular to the surface of the ferroelectric substrate 81. The ferroelectric substrate 81 has the spontaneous polarization that is oriented perpendicular to the surface. Therefore, as shown in FIGS. 13C and 13D, a region 113 having polarization in a different direction is generated, and a domain wall 114 is formed around the region 113. It is preferable that an insulating film is formed under the polarizing electrode 115 to reduce power consumption.

Figure 14A:
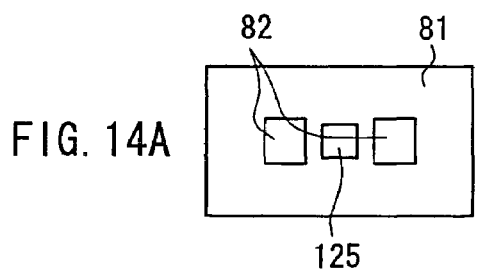
FIG. 14A is a plan view showing the configuration of a fourth electric switch in Embodiment 4 of the present invention.
Figure 14C:
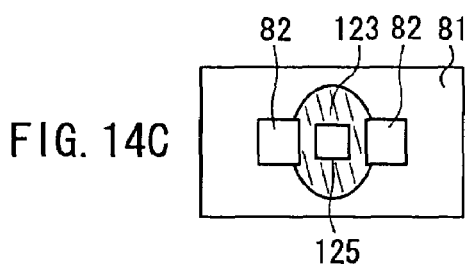
FIG. 14C is a plan view showing the configuration of the fourth electric switch in Embodiment 4, in which a domain wall is generated.
Figure 14B:
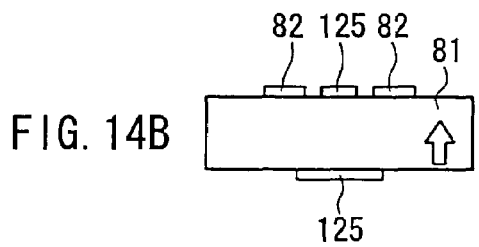
FIG. 14B is a cross-sectional view showing the configuration of the fourth electric switch in Embodiment 4 of the present invention.
Figure 14D:
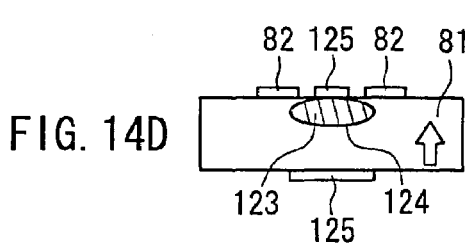
FIG. 14D is a cross-sectional view showing the configuration of the fourth electric switch in Embodiment 4, in which a domain wall is generated.

FIGS. 14A to 14D show the configuration of a fourth electric switch in Embodiment 4. FIG. 14A is a plan view of the configuration of the electric switch. FIG. 14B is a cross-sectional view of the configuration of the electric switch. FIG. 14C is a plan view of the configuration of the electric switch in which a domain wall is generated. FIG. 14D is a cross-sectional view of the configuration of the electric switch in which a domain wall is generated. The fourth electric switch includes a ferroelectric substrate 81, a pair of electrodes 82 formed on the surface of the ferroelectric substrate 81, and a pair of polarizing electrodes 125. The direction of the spontaneous polarization of the ferroelectric substrate 81 agrees with the thickness direction of the ferroelectric substrate 81, as indicated by the arrow in the drawings. The pair of electrodes 82 is placed in the same plane of the ferroelectric substrate 81 and arranged side-by-side. In the fourth electric switch, the pair of polarizing electrodes 125 is placed respectively on the surface and back of the ferroelectric substrate 81. One of the pair of polarizing electrodes 125 on the surface of the ferroelectric substrate 81 is arranged between the pair of electrodes 82. A transition from the state of FIGS. 14A and 14B to the state of FIGS. 14C and 14D is performed by applying an electric field between the pair of polarizing electrodes 125. The spontaneous polarization of the ferroelectric substrate 81 is oriented perpendicular to the surface. As shown in FIGS. 14C and 14D, a region 123 having polarization in a different direction is generated between the pair of electrodes 82, and a domain wall 124 is formed around the region 123, thereby decreasing the resistance between the pair of electrodes 82. In the fourth electric switch, it is desirable that the ferroelectric substrate 81 has a small thickness to reduce the driving voltage of a domain inversion. The thickness of the ferroelectric substrate 81 is preferably 5 μm or less.

FIGS. 15A to 15D show the configuration of a fifth electric switch in Embodiment 4. FIG. 15A is a plan view of the configuration of the electric switch. FIG. 15B is a cross-sectional view of the configuration of the electric switch. FIG. 15C is a plan view of the configuration of the electric switch in which a domain wall is generated. FIG. 15D is a cross-sectional view of the configuration of the electric switch in which a domain wall is generated. In the fifth electric switch, a ferroelectric substrate 81 is an off-cut substrate, and a pair of electrodes 132 is formed on the surface of the ferroelectric substrate 81. Moreover, a polarizing electrode 135 is provided on the ferroelectric substrate 81. A transition from the state of FIGS. 15A and 15B to the state of FIGS. 15C and 15D is performed by applying an electric field between the pair of electrodes 132 and the polarizing electrode 135. For the off-cut substrate, the direction of the spontaneous polarization tilts with respect to the surface of the crystal of the ferroelectric substrate 81. A domain-inverted region grows along the direction of the spontaneous polarization. Therefore, as shown in FIGS. 15C and 15D, a region 133 having polarization in a different direction grows inside the ferroelectric substrate 81 along the direction of the spontaneous polarization (indicated by the arrow in FIG. 15D). A domain wall 134 is formed around the region 133 and lies below the surface of the ferroelectric substrate 81. The domain wall 134 is located near the pair of electrodes 132, thereby decreasing the resistance between the pair of electrodes 132.

FIGS. 16A to 16D show the configuration of a sixth electric switch in Embodiment 4. FIG. 16A is a plan view of the configuration of the electric switch. FIG. 16B is a cross-sectional view of the configuration of the electric switch. FIG. 16C is a plan view of the configuration of the electric switch in which a domain wall is generated. FIG. 16D is a cross-sectional view of the configuration of the electric switch in which a domain wall is generated. In the sixth electric switch, a pair of polarizing electrodes 145 is formed on the surface of a ferroelectric substrate 81, instead of the polarizing electrode of the fifth electric switch as shown in FIGS. 15A to 15D. The two directions of arrangement of a pair of electrodes 132 and the pair of polarizing electrodes 145 cross at right angles. A transition from the state of FIGS. 16A and 16B to the state of FIGS. 16C and 16D is performed by applying an electric field between the pair of polarizing electrodes 145. In the state of FIGS. 16C and 16D, a region 143 having polarization in a different direction is generated, and a domain wall 144 is formed around the region 143, thereby decreasing the resistance between the pair of electrodes 132.

Figure 17A:
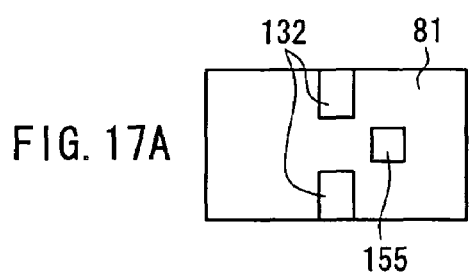
FIG. 17A is a plan view showing the configuration of a seventh electric switch in Embodiment 4 of the present invention.
Figure 17C:
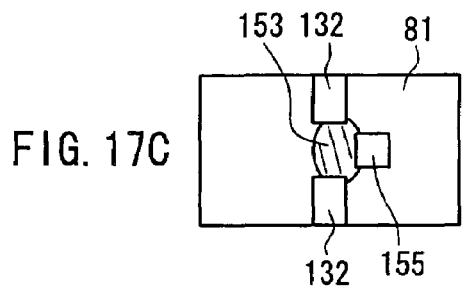
FIG. 17C is a plan view showing the configuration of the seventh electric switch in Embodiment 4, in which a domain wall is generated.
Figure 17B:
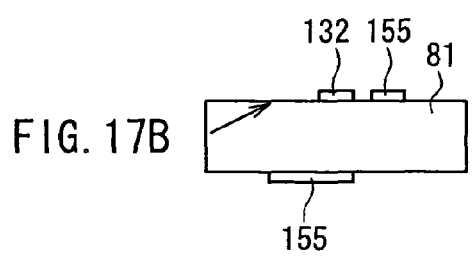
FIG. 17B is a cross-sectional view showing the configuration of the seventh electric switch in Embodiment 4 of the present invention.
Figure 17D:
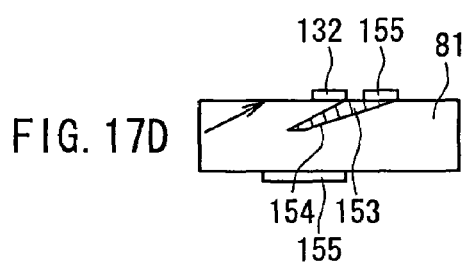
FIG. 17D is a cross-sectional view showing the configuration of the seventh electric switch in Embodiment 4, in which a domain wall is generated.

FIGS. 17A to 17D show the configuration of a seventh electric switch in Embodiment 4. FIG. 17A is a plan view of the configuration of the electric switch. FIG. 17B is a cross-sectional view of the configuration of the electric switch. FIG. 17C is a plan view of the configuration of the electric switch in which a domain wall is generated. FIG. 17D is a cross-sectional view of the configuration of the electric switch in which a domain wall is generated. In the seventh electric switch, a pair of polarizing electrodes 155 is formed respectively on the surface and back of a ferroelectric substrate 81, instead of the polarizing electrode of the fifth electric switch as shown in FIGS. 15A to 15D. A transition from the state of FIGS. 17A and 17B to the state of FIGS. 17C and 17D is performed by applying an electric field between the pair of polarizing electrodes 155. In the state of FIGS. 17C and 17D, a region 153 having polarization in a different direction is generated, and a domain wall 154 is formed around the region 153, thereby decreasing the resistance between a pair of electrodes 132.

The fifth to seventh electric switches use an off-cut substrate as the ferroelectric substrate 81. This allows the domain walls 134, 144 and 154 to be formed inside the ferroelectric substrate 81. Therefore, the polarizing electrode 135 and the pairs of polarizing electrodes 145, 155 do not come into direct contact with the domain walls 134, 144 and 154. Thus, it is possible to reduce power consumption significantly during the application of an electric field in the transition from the low to high resistance state.

The electric switch in Embodiment 4 is not limited to the configurations of the first to seventh electric switches, and may employ any configuration as long as a pair of electrodes is provided on a ferroelectric, and the direction of polarization of the ferroelectric can be changed between the pair of electrodes.

In the above explanation of the first to seventh electric switches, an electric field applying portion has been neither described nor shown in the drawings. The electric field applying portion controls the direction of polarization of the ferroelectric substrate 81. There is no particular limitation to the electric field applying portion as long as it can apply an electric field in the direction opposite to the polarization. For example, a voltage source as described in Embodiments 1 to 3 can be used. Moreover, any means for generating an electric field such as a pair of electrodes, an external power source, static electricity, electric discharge, charged particles, ions, other ferroelectrics, and a semiconductor circuit (e.g., an electric switching element made of a semiconductor material) also can be used.

Each pair of the polarizing electrodes of the second, fourth, and sixth electric switches is preferably asymmetrical in shape. It is particularly desirable that the electrode for removing different spontaneous polarization is larger than the electrode for producing it. The following is an explanation of the electrodes for removing and producing different spontaneous polarization. In a domain inversion of the ferroelectric substrate, domain nucleation occurs, and then inverted domains grow in the direction of the spontaneous polarization from the domain nuclei. For $LiNbO_3$, $LiTaO_3$, or KTP, the domain nuclei arise from a predetermined direction, i.e., the +Z surface. Thus, the electrode on the side where the domain nuclei are created (the +Z surface of $LiNbO_3$, $LiTaO_3$, or KTP) is used to produce different spontaneous polarization, and the electrode on the other side (the −Z surface of $LiNbO_3$, $LiTaO_3$, or KTP) is used to remove the different spontaneous polarization.

In a single domain crystal of $LiNbO_3$, $LiTaO_3$, or the like, a domain inversion includes the formation of domain nuclei and the growth of inverted domains from the domain nuclei. The inverted domains grow along the C axis of the crystal, and the domain nuclei are formed on the +C side. Therefore, the domain inversion propagates from positive to negative of the C axis. Accordingly, the pair of polarizing electrodes is effective when arranged along the direction of the polarization with one electrode being placed on the positive side and the other electrode being placed on the negative side of the C axis. It is desirable that the +C side electrode is smaller in shape than the −C side electrode. The width of a region where the spontaneous polarization is reversed can be restricted by the width of the +C side electrode. The −C side electrode applies an electric field to remove the spontaneous polarization. Therefore, when the −C side electrode has a larger width than the +C side electrode, the spontaneous polarization can be removed more sufficiently, and the resistance change can be increased. The C axis (crystal axis) is the same as the Z axis and indicates the direction of the principal axis of a uniaxial crystal. The direction of the spontaneous polarization of $LiNbO_3$, $LiTaO_3$, or KTP agrees with the C-axis direction.

As materials for the pair of electrodes, the pair of polarizing electrodes, and the polarizing electrode formed on the surface of the ferroelectric substrate 81, e.g., not only metallic materials such as Ta, Al, Au, Pt, and Cu, but also semiconductor materials can be used. Moreover, polysilicon is deposited on these electrode materials, on which an integrated circuit may be formed directly.

Figure 18A:
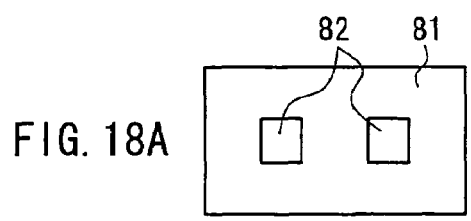
FIG. 18A is a plan view showing the configuration of an eighth electric switch in Embodiment 4 of the present invention.
Figure 18C:
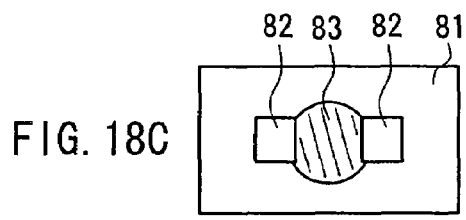
FIG. 18C is a plan view showing the configuration of the eighth electric switch in Embodiment 4, in which a domain wall is generated.
Figure 18B:
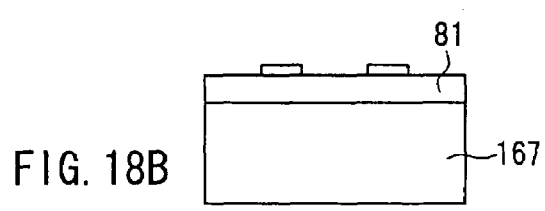
FIG. 18B is a cross-sectional view showing the configuration of the eighth electric switch in Embodiment 4 of the present invention.
Figure 18D:
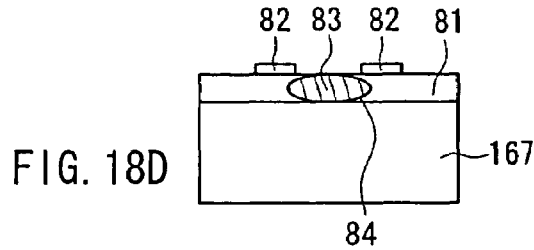
FIG. 18D is a cross-sectional view showing the configuration of the eighth electric switch in Embodiment 4, in which a domain wall is generated.

The ferroelectric substrate 81 can be made of a bulk ferroelectric material or, e.g., a thin film ferroelectric material. FIGS. 18A to 18D show the configuration of an eighth electric switch in Embodiment 4. FIG. 18A is a plan view of the configuration of the electric switch. FIG. 18B is a cross-sectional view of the configuration of the electric switch. FIG. 18C is a plan view of the configuration of the electric switch in which a domain wall is generated. FIG. 18D is a cross-sectional view of the configuration of the electric switch in which a domain wall is generated.

In FIGS. 18A to 18D, the ferroelectric substrate 81 of the electric switch as shown in FIGS. 9A to 9D is a thin film and formed on a substrate 167. The operation of the eighth electric switch is the same as the electric switch in FIGS. 9A to 9D of Embodiment 3. The thin film may be, e.g., an epitaxial film formed by epitaxial growth or an amorphous film. The epitaxial film can have the ferroelectric characteristics and is effective. Moreover, the thin film may be formed in such a manner that a ferroelectric material is bonded to a substrate, followed by thin film polishing. The bonding may be performed by using an adhesive or a direct bonding process. After bonding the ferroelectric material and the substrate, a ferroelectric thin film with a thickness of several μm can be formed, e.g., by CMP polishing. Unlike crystal growth, the thin film polishing does not limit the substrate materials. Therefore, the thin film can be formed on the substrate 167 that uses any materials such as a semiconductor material and a dielectric material. For example, when the ferroelectric thin film (ferroelectric substrate 81) is bonded on a semiconductor circuit including an electric circuit, an electric field can be applied to the ferroelectric substrate 81 by an electric field applying portion of the semiconductor circuit, and a change in resistance of the ferroelectric substrate 81 can be read simultaneously, thus providing a ferroelectric memory.

EMBODIMENT 5

An electric switch in Embodiment 5 of the present invention will be described with reference to the drawings. While various types of electric switches have been described in Embodiments 1 to 4, an electric switch was produced specifically and its properties were measured in Embodiment 5.

Figure 19:
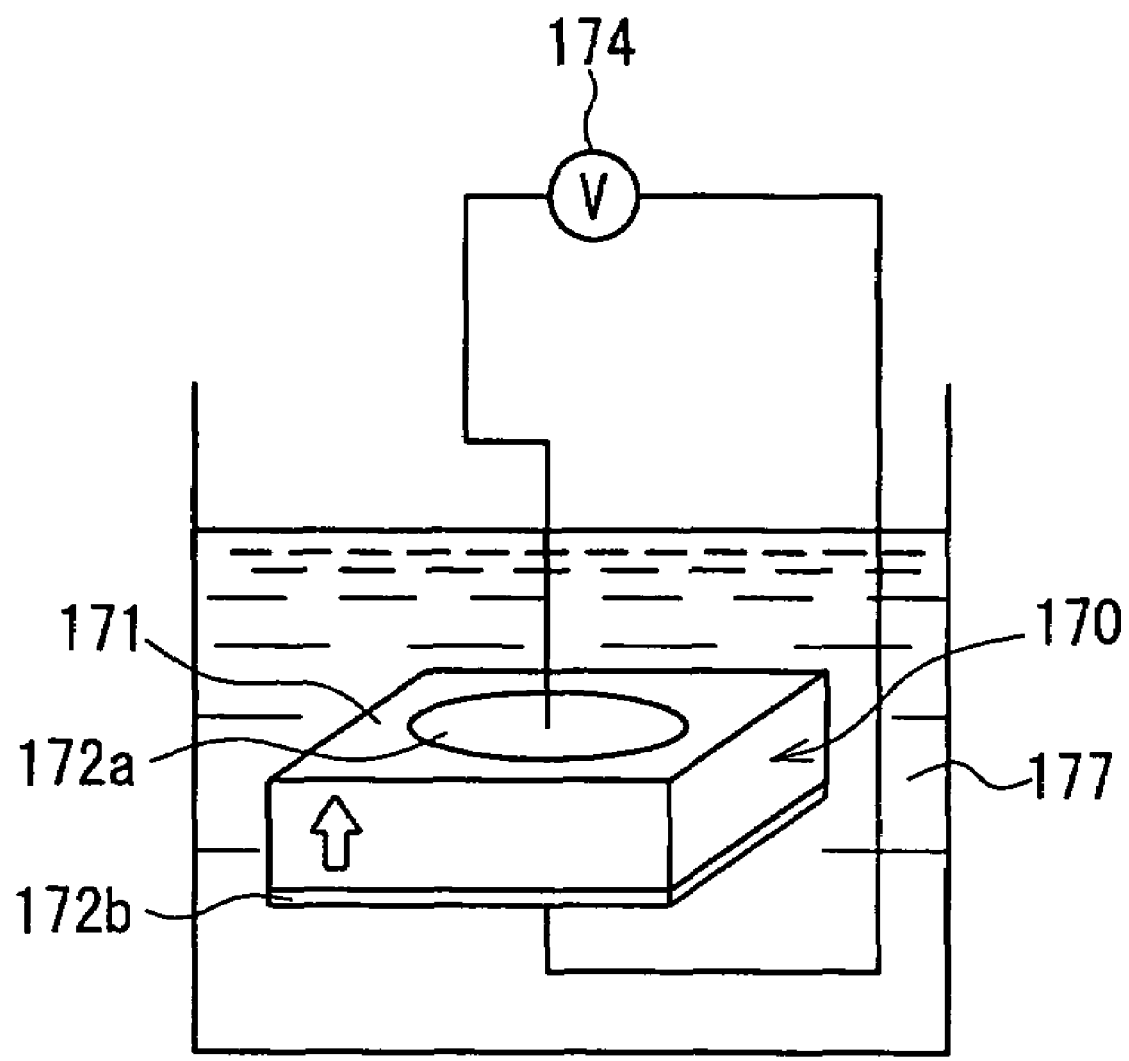
FIG. 19 is a schematic diagram showing the configuration of an electric switch and an experimental system for measuring the electric switch in Embodiment 5.

FIG. 19 is a schematic diagram showing the configuration of an electric switch and an experimental system for measuring the electric switch in Embodiment 5. As shown in FIG. 19, an electric switch 170 includes the following: an ferroelectric substrate 171; an electrode 172a formed on the surface of the ferroelectric substrate 171; an electrode 172b formed on the entire back of the ferroelectric substrate 171; and a voltage source 174 (electric field applying portion) for applying an electric field between the electrodes 172a and 172b. A Z plate of Mg-doped $LiNbO_3$ was used as the ferroelectric substrate 171.

Figure 20A:
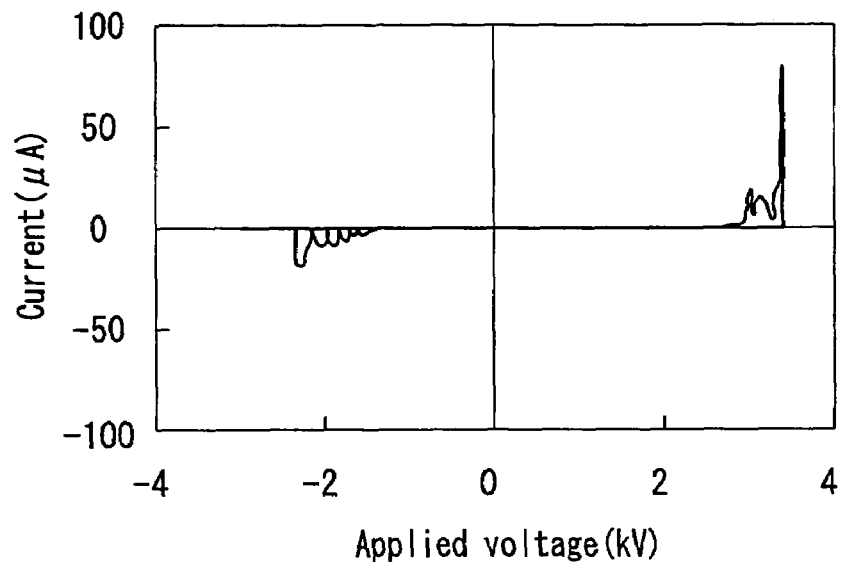
FIG. 20A shows the relationship between an applied voltage and a current when a ferroelectric substrate is formed of non-doped $LiNbO_3$ and has a thickness of 0.15 mm.
Figure 20B:
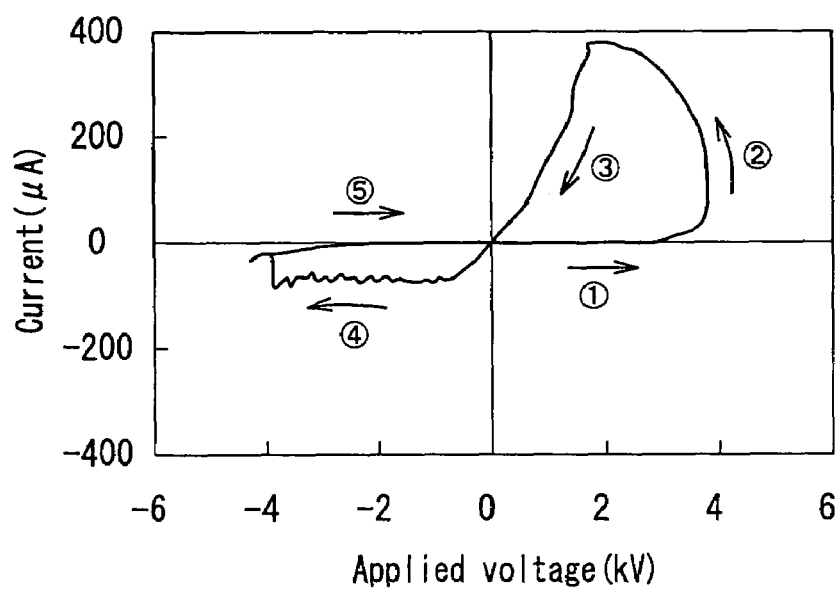
FIG. 20B shows the relationship between an applied electric field and a current when a ferroelectric substrate is formed of 5 mol % Mg-doped $LiNbO_3$ and has a thickness of 1 mm.

For measurement of the properties, the electric switch 170 was put into an insulating liquid 177, and an electric field was applied between the electrodes 172a and 172b, as shown in FIG. 19. The reason for putting the electric switch 170 into the insulating liquid 177 is to prevent electric discharge during the application of an electric field. The relationship between the applied voltage and a current between the electrodes 172a and 172b was measured. The direction of the spontaneous polarization of the ferroelectric substrate 171 is indicated by the arrow in FIG. 19. FIGS. 20A and 20B show the relationship between an applied voltage and a current of the electric switch 170. In FIG. 19, the direction opposite to the spontaneous polarization is defined as positive. Therefore, the downward direction is positive in FIG. 19. FIG. 20A shows the relationship between an applied voltage and a current when the ferroelectric substrate 171 is formed of non-doped $LiNbO_3$ and has a thickness of 0.15 mm. FIG. 20B shows the relationship between an applied electric field and a current when the ferroelectric substrate 171 is formed of 5 mol % Mg-doped $LiNbO_3$ and has a thickness of 1 mm.

In FIG. 20A, the applied electric field is increased, and the spontaneous polarization starts to be reversed when the applied voltage is 3.15 kV. At this time, the applied electric field is 21 kV/mm and corresponds to the reverse electric field Ec. When the electric field is greater than this value, a current flows between the electrodes 172a and 172b. The current is stopped after the spontaneous polarization has been reversed fully between the electrodes 172a and 172b. The amount of electric charge Q flowing through the ferroelectric substrate 171 is proportional to the electrode area S and the spontaneous polarization Ps, which is expressed by $Q=2 \, S \times Ps$. Further application of a negative voltage between the electrodes 172a and 172b allows a current to flow again while the polarization reverts to its former state. This is a general property of a ferroelectric and caused by the movement of the electric charge according to a reversal of the polarization.

In FIG. 20B, the applied electric field is increased, and the spontaneous polarization starts to be reversed when the applied voltage is 3.9 kV. At this time, the applied electric field is 3.9 kV/mm and corresponds to the reverse electric field Ec. When the electric field is greater than this value, a current starts flowing. The current continues to flow because the resistance between the electrodes 172a and 172b is low. In this state, the resistance between the electrodes was measured, and the result showed that the resistance was decreased even by eight figures compared to the resistance before the domain inversion. Subsequently, when the voltage is reduced to −3.9 kV/mm, the polarization reverts, and the current is stopped. In this state, the resistance between the electrodes was measured on removal of the electric field, and the result showed that the resistance was restored to approximately the same value as the original crystal. The above operations are performed in the order of "1", "2", "3", "4", and "5" in FIG. 20.

Figures 21A, 21B:
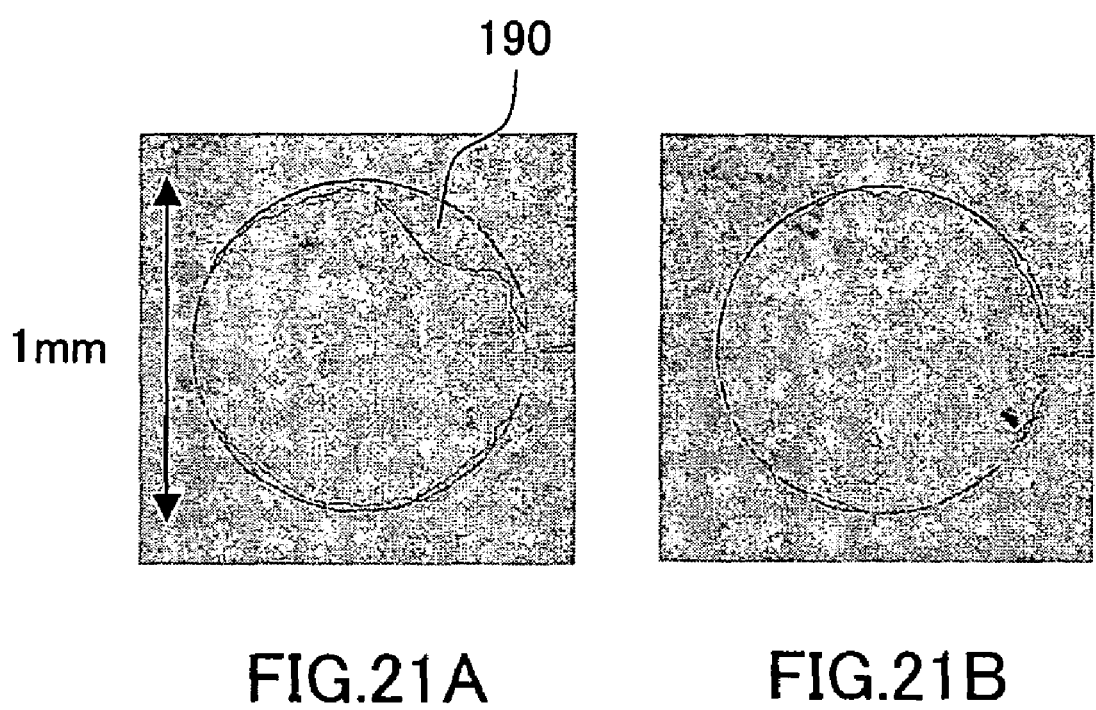
FIG. 21A shows the state of polarization under the electrode when the polarization starts to be reversed and the resistance is decreased.
FIG. 21B shows the state of polarization under the electrode when the reversed polarization reverts, and the resistance returns to the initial condition.

FIGS. 21A and 21B show the observation of the states of a domain-inverted region between the electrodes 172a and 172b. FIG. 21A illustrates the state of polarization under the electrode 172a when the polarization starts to be reversed and the resistance is decreased. FIG. 21B illustrates the states of polarization under the electrode 172a when the reversed polarization reverts, and the resistance returns to the initial condition. As shown in FIG. 21A, a region 190 having polarization in a different direction is formed in part of the ferroelectric substrate 171. As shown in FIG. 21B, there is no domain-inverted region, and the polarization direction is aligned. This makes it clear that the formation and removal of a domain-inverted region relates to a change in resistance between the electrodes 172a and 172b. In other words, the electric resistance of the ferroelectric substrate 171 can be controlled by reversal or non-reversal of the spontaneous polarization of the ferroelectric substrate 171.

Moreover, the ferroelectric substrate 171 can be formed in a smaller thickness to reduce the reverse voltage, resulting in low power consumption of the electric switch 170. For example, if the ferroelectric substrate 171 has a thickness of about 100 nm and is doped with 3 mol % of Mg, the reverse voltage is about 1.3 V, so that low-voltage driving can be performed. When the ferroelectric substrate 171 is in the amorphous or microcrystalline state rather than the crystalline state, the reverse voltage is increased several times as much as the single crystal. Therefore, the morality of a metal additive is preferably 3 mol % or more in view of the applied voltage. Moreover, the applied electric field significantly depends on the crystal temperature. Specifically, if the temperature of the ferroelectric substrate 171 is raised to 120° C., the reverse electric field Ec is reduced approximately by half. Thus, the electric switch 170 may include a heating portion such as a heater for heating the ferroelectric substrate 171. When the ferroelectric substrate 171 is heated during switching, low-voltage driving can be performed. Moreover, a crystal distortion caused by a domain inversion is reduced by heating, and the electric switch 170 greatly can enhance resistance to repeated switching operations. The temperature of the ferroelectric substrate 171 during switching is preferably not less than 20° C., and more preferably not less than 40° C.

The reverse electric field Ec can be reduced not only by increasing the temperature of the ferroelectric substrate 171, but also by irradiating the ferroelectric substrate 171 with light close to ultraviolet rays. The wavelength of the light is preferably not more than 500 nm, and more preferably not more than 400 nm. The short-wavelength light irradiation can reduce the reverse electric field Ec and facilitate a domain inversion. Therefore, the number of switching operations can be increased significantly to make the life of the electric switch 170 longer. Moreover, the stored switching state can be erased collectively by applying an electric field to the ferroelectric substrate 171 while it is irradiated with short-wavelength light. This can ensure successful erasure without leaving any residue.

In a general congruent composition, the reverse electric field is inversely proportional to the doping amount of Mg. For example, the reverse electric field Ec is 21 kV/mm for non-doping, about 12 kV/mm for 3 mol % of Mg doping, and about 4 kV/mm for 5 mol % of Mg doping. Therefore, the reverse electric field Ec can be controlled by adjusting the doping amount of metal. When the ferroelectric substrate 171 has a thickness of, e.g., about 100 nm, the reverse voltage is 0.4 V for 5 mol % doping. The reverse electric field is reduced further as the ferroelectric substrate 171 becomes thinner. By reducing the reverse electric field, it is possible to achieve a high-speed operation and high integration. However, if the reverse electric field is extremely low, the polarization is likely to be reversed or revert even with a small noise, and the stored data is erased. Therefore, an appropriate reverse electric field should be applied by adjusting the thickness of the ferroelectric substrate 171 and the morality of a metal additive.

The reverse voltage is preferably 0.01 V to 10V. When the reverse voltage is less than 0.01 V, the malfunction of a memory is increased due to noise or disturbance. It is preferable that the reverse voltage falls in the above range by adjusting the amount of metal additive and the thickness of the ferroelectric substrate 171.

The reverse electric field Ec also can be controlled by the crystal composition. When the crystal composition is stoichiometric, the reverse electric field Ec can be reduced significantly. The measurement showed that the dependence on the morality of Mg is very small, and the reverse electric field Ec was about 4 kV/mm for a doping amount of 1 to 5 mol %. The suitable reverse voltage may be achieved by adjusting the crystal composition in addition to the amount of metal additive and the thickness of the ferroelectric substrate 171.

Figure 22:
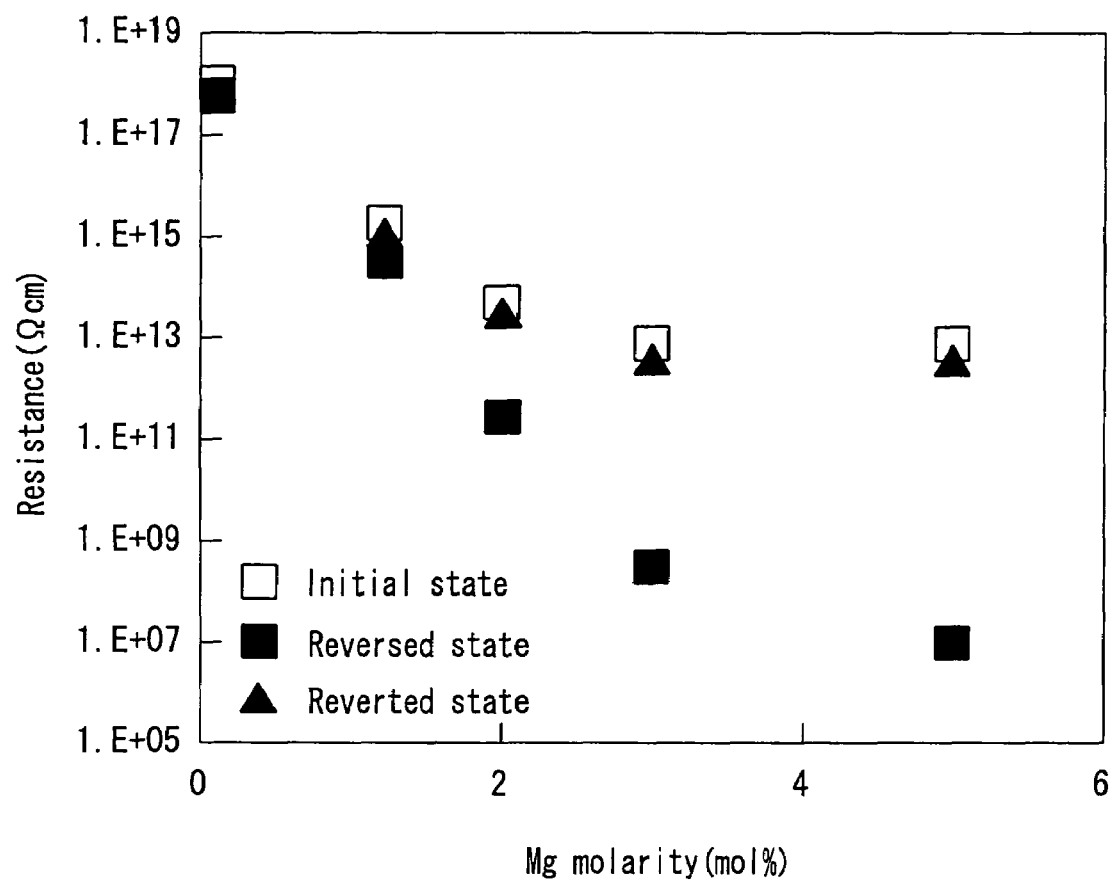
FIG. 22 shows the relationship between the morality of Mg with which a ferroelectric substrate is doped and the amount of change in electric resistance between the electrodes.

Next, a change in electric resistance due to a domain inversion and the doping amount of Mg were studied. FIG. 22 shows the relationship between the morality of Mg with which the ferroelectric substrate 171 is doped and the amount of change in electric resistance between the electrodes 172a and 172b. The study confirmed that the reverse electric field Ec for reversing the spontaneous polarization was reduced with increasing the doping amount of Mg of the ferroelectric substrate 171. In FIG. 22, □ (white square) represents a state (initial state) in which no voltage is applied to the ferroelectric substrate 171, ■ (black square) represents a state (reversed state) in which the polarization is reversed in part of the ferroelectric substrate 171, and thus the resistance is low, and ▲ (black triangle) represents a state (reverted state) in which the polarization reverts.

As shown in FIG. 22, the amount of change in electric resistance increases with increasing the doping amount of Mg. For 5 mol %, the resistance value was changed by a maximum of six figures between the reversed state and the initial and reverted states. In FIG. 22, at least 1 mol % of metal should be added to achieve the resistance change in single figures or more so that the ferroelectric substrate 171 can function as a switch. It is desirable to add at least 3 mol % of metal because the resistance change can be in four figures or more.

Figure 23A:
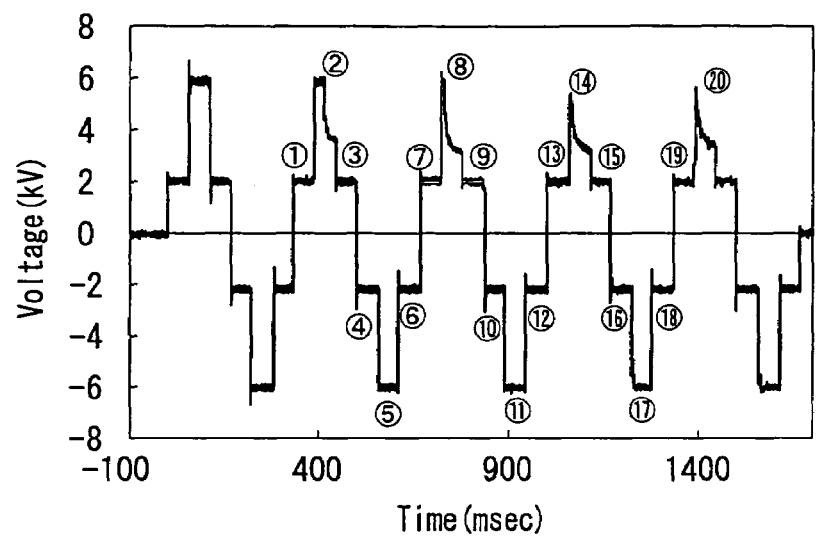
FIG. 23A shows a voltage waveform between the electrodes over time.
Figure 23B:
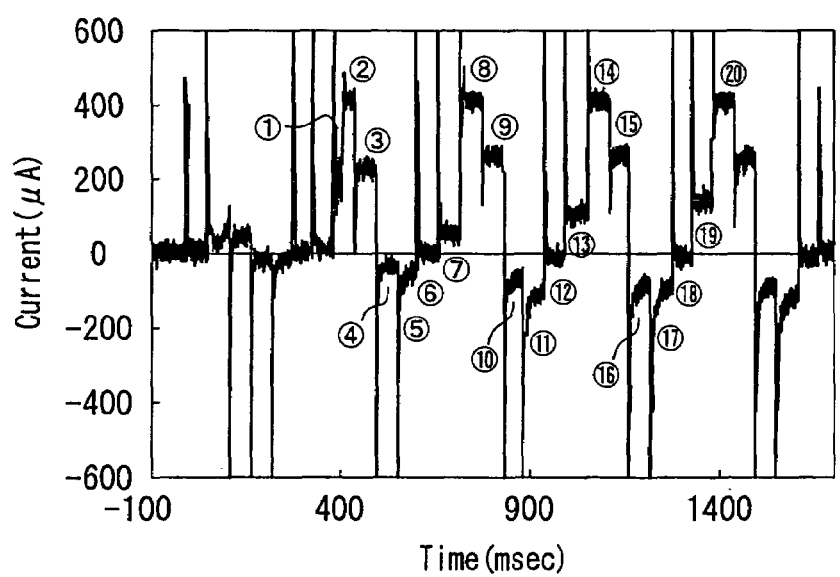
FIG. 23B shows a current waveform between the electrodes over time.

Next, continuous electric switching characteristics were measured by using the electric switch 170. The ferroelectric substrate 171 was doped with 5 mol % of Mg and had a thickness of 2 mm. The temperature was 120° C. In this case, the reverse voltage was about 4 kV. The reverse electric field was about 2 kV/mm. The applied voltage was a maximum of 6 kV, and the current value was a maximum of 400 mA. FIGS. 23A and 23B show the results of the measurement. FIG. 23A shows a voltage waveform between the electrodes 172a and 172b over time. FIG. 23B shows a current waveform between the electrodes 172a and 172b over time. In FIG. 23A, a voltage applied in the direction opposite to the spontaneous polarization of the ferroelectric substrate 171 is identified as positive, and a voltage applied in the direction of the spontaneous polarization is identified as negative. Similarly, in FIG. 23B, a current flowing in the direction opposite to the spontaneous polarization of the ferroelectric substrate 171 is identified as positive, and a current flowing in the direction of the spontaneous polarization is identified negative. Each of the numbers given in FIGS. 23A and 23B indicates the same time.

When a positive voltage greater than the reverse voltage is applied ("2", "8", "14" and "20"), a current flows as shown in FIG. 23B. Therefore, the resistance between the electrodes 172a and 172b is low. When a voltage (−6 kV) not greater than the voltage required for a reversion is applied ("5", "11" and "17"), the resistance is increased and the current is reduced. The measurement confirmed that the electric resistance was decreased by a domain inversion and increased by a reversion. Thus, the electric switch 170 can act as a switch.

The measurement also shows that an initialization process is necessary for use of the electric switch 170, and the resistance fluctuates with time. First, the initialization process is described below. In the early stages of applying an electric field to the ferroelectric substrate 171, i.e., with those pulses preceding "1", the current change (FIG. 23B) is small compared to the voltage change (FIG. 23A). This indicates that a change in resistance by the application of an electric field is small. In the initial state, therefore, the electric resistance is not changed sufficiently by the application of an electric field. To avoid this, switching that utilizes a domain inversion caused by the application of an electric field may be performed two or more times before using the electric switch 170. Consequently, the resistance of the ferroelectric substrate 171 is change by the application of an electric field, and the electric switch 170 can make high-speed switching response. Thus, the initialization process applies an electric field repeatedly to the electric switch 170 so that the electric switch 170 operates properly.

Next, the fluctuation in resistance with time is described below. After the ferroelectric substrate 171 reverts to a high resistance state by applying a pulse of −6 kV, a negative electric field is applied ("6", "12" and "18"). In this case, a current can hardly flow, and the resistance is very high, as shown in FIG. 23B. However, when a positive electric field is applied ("7", "13" and "19"), the current value is increased gradually with time. Specifically, the current value is 50 µA for "7", 100 µA for "13", and 120 µA for "19". Therefore, the application of a positive electric field can increase the current value successively with time even under the same conditions. Correspondingly, the resistance also is decreased with time. Although the specific cause of a phenomenon in which the resistance fluctuates with time has not been understood yet, it can be attributed to aging of a domain wall or fatigue.

When the electric switch 170 constitutes a memory, the electric resistance is changed by a reversal or reversion of the spontaneous polarization, and the resultant resistance is read to distinguish the memory states. To identify the state of resistance electrically, a resistance value should be determined by applying an electric field to the domain-inverted region. As is evident from this experimental result, the electric resistance is changed significantly depending on the presence or absence of a domain inversion. However, it is desirable to apply an electric field in the same direction as the original spontaneous polarization so that the resistance can be determined stably. As shown in FIG. 23B, the resistance may be determined by reading each of the resistance differences between "4" and "6", between "10" and "12", and between "16" and "18". It is desirable to read the resistance in the presence of a negative electric field (oriented in the same direction as the spontaneous polarization). By reading the resistance in the negative electric field, a change in resistance can be large and stable. In FIG. 23B, if the resistance is determined by applying a positive electric field, the resistance difference becomes smaller, as is evident, e.g., from a comparison of the resistance difference between "1" and "3" and that between "13" and "15". As the resistance is changed gradually, the resistance difference is reduced, thus causing errors in determination of the resistance.

In Embodiment 5, Mg-doped $LiNbO_3$ is used as the ferroelectric substrate 171. Other than this material, $LiTaO_3$ also varies in electric conductivity by adding a metal additive such as Mg. When a change in electric resistance due to a domain inversion of a ferroelectric occurs by the addition of metal, it significantly depends on the crystal structure. The ferroelectric substrate 171 preferably has an ilmenite structure to which $LiNbO_3$ belongs. As the ferroelectric substrate 171, polarized $MgO:LiNbO_3$ is used. However, other metals also may be added to the ferroelectric. For example, $LiNbO_3$, $LiTaO_3$, or KTP doped with metals such as In, SC, Cu, and Fe, or a mixed crystal of any of these crystals can provide a similar effect. Moreover, other ferroelectric materials can show a similar variation in electric conductivity as long as the doping amount of metal is increased.

Although the ferroelectric substrate 171 is formed of a single domain ferroelectric crystal, a material including crystal grains such as amorphous crystals or microcrystals can have a similar effect. An amorphous or microcrystalline structure can use a thin film material and does not require crystal growth of the bulk, which facilitates the fabrication of a device. Moreover, the amorphous or microcrystalline structure is preferred because the doping amount of metal additive can be increased, and therefore the amount of change in electric resistance can be increased. However, a lattice distortion of the crystals increases with increasing the doping amount of metal. This may cause cracks or the like when a large crystal is pulled up, and makes it difficult to ensure uniform growth of the large crystal. For example, it is difficult to add 10 mol % or more of Mg to $LiNbO_3$. Thus, the doping amount is preferably 10 mol % or less for a single crystal substrate. With the amorphous or microcrystalline structure, it is possible to increase the doping amount further. Moreover, a material such as ceramic obtained by sintering microcrystals also can provide similar properties. In this case, the boundary of regions that differ from each other in polarization direction needs to be present in the thin film to form a domain wall. Therefore, the thin film should include crystal grains having a predetermined size or more. For microcrystals, the grain size may be 1 µm or more. The thin film can be produced, e.g., by epitaxial growth, MBE, sputtering, a sol-gel process, or laser ablation.

When microcrystalline, amorphous or ceramic materials, a single crystal, or a thin film crystal obtained by liquid-phase growth is used as the ferroelectric substrate, a poling process is important. In the poling process, the temperature of the substrate is raised near the Curie temperature of the crystals, and then an electric field is applied so that the polarization is oriented in one direction. Since the spontaneous polarization is produced after raising the temperature, a crystal distortion is not likely to remain in the domain wall. Therefore, when used in the configuration of the present invention, the substrate preferably has been poled in the direction in which an electric field is applied to control the polarization. Moreover, it is effective to irradiate the substrate with short-wavelength light of not more than 500 μm during the poling process.

In Embodiment 5, the electrodes 172a and 172b are formed directly on the ferroelectric substrate 171. In this case, an insulating layer may be provided between the ferroelectric substrate 171 and each of the electrodes 172a and 172b, thereby achieving low power consumption. The power consumption also can be reduced by applying an electric field in the form of pulses and increasing the resistance for a short time.

The ferroelectric substrate 171 is not limited to a Z-plate substrate whose spontaneous polarization is oriented perpendicular to the surface. For example, an X or Y plate whose spontaneous polarization is oriented parallel to the substrate plane, or an off-cut substrate in which the direction of the spontaneous polarization obliquely crosses the substrate surface also can be used. The off-cut substrate is more preferred because of its high conformability of polarization and good reproducibility of a uniform domain inversion.

As shown in FIGS. 23A and 23B, a large amount of current flows instantaneously each time a domain inversion occurs ("2", "8", "14" and "20") and each time a reversion occurs ("5", "11" and "17"). This current results from the movement of electric charge, and the amount of the electric charge can be expressed by 2 Ps×S. The current flows because the resistance of the ferroelectric substrate 171 is low. The electric switch 170 may be activated by use of this low resistance of the ferroelectric substrate 171.

In the electric switch, the application of an electric field is used generally as a means for reversing the polarization. For example, any means for generating an electric field such as a pair of electrodes, an external power source, static electricity, electric discharge, charged particles, ions, other ferroelectrics, and a semiconductor circuit can be used as long as they can change the spontaneous polarization of a ferroelectric and apply an electric field in the direction opposite to the spontaneous polarization. Moreover, the spontaneous polarization may be reversed by external stress. In this case, stress is applied locally to the ferroelectric using a piezoelectric material or the like, thus controlling the spontaneous polarization. It is also possible to apply the stress along with an electric field. Further, the spontaneous polarization may be reversed by locally heating the ferroelectric and utilizing the generation of an electric field due to a pyroelectric effect.

Depending on the electrode shape, there are some structures to improve the electric conductivity. As described above, the electric resistance is decreased in the domain wall portion. Therefore, a further decrease in electric resistance can be achieved by increasing the area of the domain wall around the domain-inverted region. Since the domain-inverted region depends on the electrode shape, the area of the domain wall can be increased, e.g., by using a comb-shaped electrode.

In the electric switches of Embodiments 1 to 5, it is desirable that an insulating film is formed between the electrode for producing polarization and the ferroelectric substrate. The electric switch can be driven at a low current, thus reducing power consumption.

EMBODIMENT 6

A memory device in Embodiment 6 of the present invention will be described with reference to the drawings. The memory device of Embodiment 6 includes a two-dimensional array of the electric switches in any of Embodiments 1 to 5. By reading high and low resistance of the electric switches, the memory device can function as a two-dimensional memory.

Figure 24:
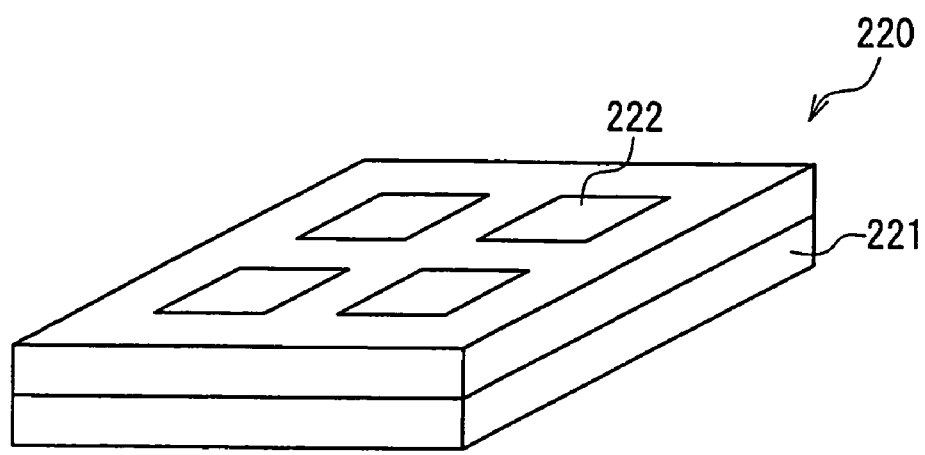
FIG. 24 is a perspective view showing the configuration of a memory device in Embodiment 6.

FIG. 24 is a perspective view showing the configuration of a memory device 220 in Embodiment 6. In the memory device 220, a plurality of electric switches 222 in any of Embodiments 1 to 5 are arranged on a semiconductor integrated circuit 221. The semiconductor integrated circuit 221 is formed of a silicon LSI and can apply an electric field to the electric switches 222. The application of an electric field changes the direction of the spontaneous polarization of a ferroelectric substrate of each of the electric switches 222, so that the electric conductivity can be varied in a portion where the electric field is applied. Such a change in spontaneous polarization of the ferroelectric substrate is stable. Therefore, the reversed state is maintained even after removal of the electric field. Moreover, the memory device 220 can store a state very stably for a long time without requiring an external electric supply. It also can read the stored state by reading the resistance of each of the electric switches 222. The stored state remains unchanged after reading. In other words, the memory device 220 can control the electric field applied to the electric switches 222 with the semiconductor integrated circuit 221, store a state by producing or removing the spontaneous polarization, and detect the stored state. Thus, the memory device 220 functions successfully. By combining the electric switches 222 and the semiconductor integrated circuit 221, it is possible to achieve both miniaturization and integration.

A standard voltage generated in the semiconductor integrated circuit 221 is about several V, and low-voltage driving is desirable. For this reason, a thin ferroelectric may be suitable for each of the electric switches 222. The thickness of the ferroelectric substrate should be several μm or less.

However, when the temperature changes sharply, the ferroelectric substrate causes a surface electric field due to a pyroelectric effect. This surface electric field may eliminate part of the spontaneous polarization stored. To ensure a stable operation of the circuit, a configuration is required to prevent the pyroelectric effect. For example, a package configuration can avoid sharp temperature changes. The operating temperature range is limited to about room temperature ±50° C. Moreover, a protection circuit may be used against sharp temperature changes by monitoring the external temperature. Alternatively, a conductive thin film may be formed on the surface of the ferroelectric substrate to eliminate pyroelectric charge generated on the surface. In this case, switching electrodes are provided on one surface of the ferroelectric substrate, and a semiconductor circuit is brought into direct contact with this surface, thereby driving the electric switch. A conductive film is deposited on the other surface so as to prevent the generation of the pyroelectric charge.

It is desirable that the memory device of Embodiment 5 includes a heating portion to erase the stored information collectively. The heating portion may be, e.g., a heater. The heater can increase the temperature of the ferroelectric substrates of all the electric switches 222. When a voltage is applied after the temperature of the ferroelectric substrates of all the electric switches 222 has been raised by the heater, all the ferroelectric substrates return to the original high resistance state that is close to an insulator. In this case, the ferroelectric substrates are heated at a temperature of not more than the Curie temperature, and then a voltage is applied. Consequently, a distortion in the domain wall is removed, and the electric resistance is increased to nearly the value of the original insulator. The heating temperature is preferably 200° C. or more. The collective erasure also can be achieved simply by raising the temperature. Under these conditions, the polarization is oriented in one direction by the application of an electric field. Subsequently, when a voltage is applied in the direction opposite to this direction, the electric characteristics can be changed to reduce the resistance.

The memory device may include an ultraviolet radiating portion instead of the heater. The ultraviolet radiating portion can irradiate the ferroelectric substrates of the electric switches 222 with ultraviolet rays having a wavelength of about 400 nm or less. When the ferroelectric substrates of all the electric switches 222 are irradiated with the ultraviolet rays emitted from the ultraviolet radiating portion, a crystal distortion in the domain wall is relaxed, and the electric resistance is increased to nearly the value of the original insulator. Therefore, a plurality of electric switches have high resistance, so that the stored information can be erased collectively from the memory device 220.

It is also possible to perform the heating process with the ultraviolet radiation. The collective erasure is effective in refreshing the resistance. If the switching characteristics of each of the electric switches 222 are degraded by repeated use of the memory device 220, a refresh can improve the switching characteristics.

The memory device of Embodiment 6 differs from a conventional ferroelectric memory in that the electric conductivity of a ferroelectric itself is varied according to the direction of the spontaneous polarization, and the difference is detected electrically and used as a memory device.

Figure 25:
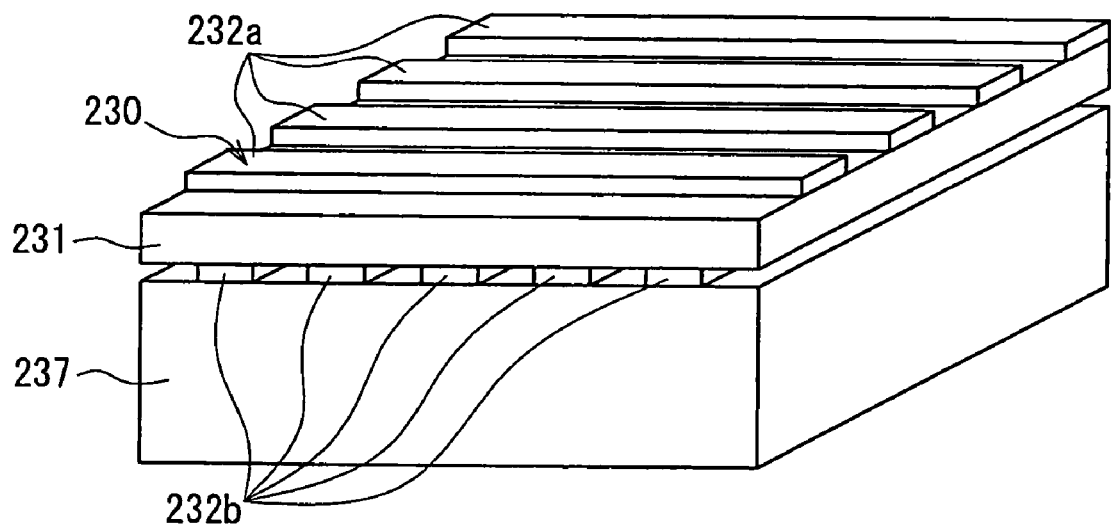
FIG. 25 is a perspective view specifically showing the configuration of a memory device in Embodiment 6.

FIG. 25 is a perspective view specifically showing the configuration of a memory device in Embodiment 6. As shown in FIG. 25, stripe-shaped electrodes 232b are formed on a substrate 237 provided with a semiconductor integrated circuit. A ferroelectric thin film 231 is formed on the electrodes 232b. Moreover, stripe-shaped electrodes 232a are formed on the ferroelectric thin film 231 and arranged at right angles to the electrodes 232b. With this configuration, a plurality of electric switches 230 including the ferroelectric thin film 231 sandwiched between the electrodes 232a and 232b are arranged in a matrix to form a memory device. That is, a single electric switch 230 is formed by sandwiching the ferroelectric thin film 231 between the electrodes 232a and 232b. The memory device further includes an electric field applying portion (not shown) that can apply an electric field between the electrodes 232a and 232b sandwiching the ferroelectric thin film 231. The on-off control of the electric switches 230 in a matrix form can be performed by using the electric field applying portion. Specifically, an electric field is applied by selecting any one of the stripes of the electrodes 232a and the electrodes 232b, respectively. Then, the electric field is applied selectively to the ferroelectric thin film 231 at the intersection of two electrodes 232a and 232b, so that the resistance can be changed. Moreover, a plurality of electrodes 232a and 232b may be selected simultaneously, thereby writing data into a plurality of points at a time. This state can be read by inversely selecting the electrodes and detecting the resistance between the electrodes.

As described above, the memory device of Embodiment 6 can simplify the configuration and achieve high integration. The memory device also can perform simultaneous writing, and therefore improve the data processing speed greatly.

The electric switches of Embodiments 1 to 5 employ the feature that the electric conductivity of a ferroelectric can be varied significantly by controlling the spontaneous polarization. Specifically, the ferroelectric changes from high resistance to low resistance due to a reversal of the spontaneous polarization. Such a change in resistance can make a transition from an insulator to a semiconductor of the ferroelectric. The electric switch utilizing these properties can achieve a high degree of integration with a simple configuration.

Although the application of an electric field is required to reverse the spontaneous polarization, the electric field is not required after the reversal. Therefore, since the above electric switch can retain the state, e.g., a plurality of the electric switches can be used as a nonvolatile memory.

The use of a thin film as a ferroelectric material is effective in providing a memory device with a high degree of integration because it is easy to form the thin film monolithically with the semiconductor integrated circuit.

In the above explanation of the electric switches of Embodiments 1 to 5 and the memory device of Embodiment 6, the configurations, materials, or the like have been described merely as examples, and the present invention is not limited to those specific examples.

INDUSTRIAL APPLICABILITY

An electric switch and a memory device using the electric switch of the present invention can retain the stored state. Therefore, they can be applied, e.g., to a nonvolatile memory, a recording medium using the nonvolatile memory, or a wide range of equipment including them.

The invention claimed is:

1. An electric switch, comprising:
a ferroelectric substrate to which a metal is added;
a pair of electrodes provided on the ferroelectric substrate; and
an electric field applying portion for changing a direction of polarization in part of the ferroelectric substrate between the pair of electrodes,
wherein a resistance value of the ferroelectric substrate is changed by changing the direction of the polarization.

2. The electric switch according to claim 1, wherein the ferroelectric substrate is an oxide.

3. The electric switch according to claim 1, wherein the ferroelectric substrate is made of a single domain ferroelectric material, and
the electric field applying portion applies an electric field in a direction opposite to the polarization of the ferroelectric substrate.

4. The electric switch according to claim 1, wherein while the polarization is reversed, the ferroelectric substrate retains an internal electric field that is opposite to the reversed polarization.

5. The electric switch according to claim 1, wherein the electric field applying portion applies an electric field to the ferroelectric substrate, and
the electric field is an alternating-current electric field with a frequency of 5 Hz or more.

6. The electric switch according to claim 1, wherein the electric field applying portion applies an electric field to the ferroelectric substrate, and
the electric field is a high-frequency superimposed electric field.

7. The electric switch according to claim 1, wherein the metal added to the ferroelectric substrate is at least one selected from the group consisting of Mg, Zn, In, SC, Cu, and Fe, and
the ferroelectric substrate is $LiNbO_3$.

8. The electric switch according to claim 7, wherein the ferroelectric substrate is a Z plate of $LiNbO_3$ to which the at least one metal is added.

9. The electric switch according to claim 1, wherein the ferroelectric substrate is a ferroelectric crystal that is treated to have a single domain structure.

10. The electric switch according to claim 1, wherein the ferroelectric substrate is made of a polycrystalline or amorphous material.

11. The electric switch according to claim 1, wherein the pair of electrodes is formed along a direction of spontaneous polarization of the ferroelectric substrate, and
the direction of polarization in part of the ferroelectric substrate is controlled by applying an electric field between the pair of electrodes with the electric field applying portion, so that resistance between the pair of electrodes is controlled.

12. The electric switch according to claim 11, further comprising a pair of electrodes formed in a direction substantially perpendicular to the direction of spontaneous polarization of the ferroelectric substrate,
wherein the direction of polarization in part of the ferroelectric substrate is controlled by applying an electric field between the pair of electrodes formed along the direction of the spontaneous polarization with the electric field applying portion, so that resistance between the pair of electrodes fanned in the direction substantially perpendicular to the direction of the spontaneous polarization is controlled.

13. The electric switch according to claim 1, wherein when the electric field applying portion applies an electric field to the ferroelectric substrate, the direction of polarization of the ferroelectric substrate is changed in 10% to 90% of a region where the electric field is applied.

14. The electric switch according to claim 1, wherein a direction of spontaneous polarization of the ferroelectric substrate is substantially perpendicular to a surface of the ferroelectric substrate.

15. The electric switch according to claim 1, wherein a direction of spontaneous polarization of the ferroelectric substrate is substantially parallel to a surface of the ferroelectric substrate.

16. The electric switch according to claim 1, wherein a maximum resistance value is at least 100 times as large as a minimum resistance value of the ferroelectric substrate.

17. The electric switch according to claim 1, wherein at least one of the pair of electrodes is a comb-shaped electrode.

18. The electric switch according to claim 17, wherein the ferroelectric substrate is a single domain crystal, and a direction of electrode fingers of the comb-shaped electrode is substantially parallel to a Y-axis direction of the crystal.

19. The electric switch according to claim 1, wherein the electric field applying portion controls the direction of polarization of the ferroelectric substrate so that a domain wall that is a boundary separating different polarization directions is formed or removed in a vicinity of a region between the pair of electrodes, thereby changing the resistance value between the pair of electrodes.

20. The electric switch according to claim 1, wherein grooves are formed in a surface of the ferroelectric substrate, and the pair of electrodes is provided in the grooves.

21. The electric switch according to claim 1, wherein a concentration of the added metal is 1 mol % or more.

22. The electric switch according to claim 1, wherein a direction of spontaneous polarization of the ferroelectric substrate tilts with respect to a surface of the ferroelectric substrate.

23. The electric switch according to claim 1, wherein a pair of polarizing electrodes is provided on a surface of the ferroelectric substrate, and the electric field applying portion applies an electric field between the pair of polarizing electrodes.

24. The electric switch according to claim 1, wherein a pair of polarizing electrodes is provided in grooves formed in a surface of the ferroelectric substrate, and the electric field applying portion applies an electric field between the pair of polarizing electrodes.

25. The electric switch according to claim 1, wherein the electric field applying portion is an electric switching element made of a semiconductor material.

26. The electric switch according to claim 1, further comprising a heating portion for heating the ferroelectric substrate.

27. The electric switch according to claim 1, wherein the ferroelectric substrate has an ilmenite structure.

28. The electric switch according to claim 1, wherein a current flows between the pair of electrodes by movement of electric charge of the ferroelectric substrate while the direction of the polarization is changed, so that the resistance value between the pair of electrodes is changed.

29. The electric switch according to claim 1, wherein the ferroelectric substrate is subjected to a poling process so that spontaneous polarization is oriented substantially in one direction.

30. The electric switch according to claim 1, wherein an insulating layer is provided between at least one of the pair of electrodes and the ferroclectric substrate.

31. A memory device comprising a plurality of electric switches according to claim 1 and storing the resistance value of the ferroelectric substrate of each of the electric switches.

32. The memory device according to claim 31, wherein the plurality of electric switches are arranged two-dimensionally.

33. The memory device according to claim 31, wherein the plurality of electric switches are formed on a semiconductor integrated circuit, and
the voltage applying portions are controlled by the semiconductor integrated circuit.

34. The memory device according to claim 33, wherein the resistance value of the ferroelectric substrate of each of the electric switches is controlled and detected by the semiconductor integrated circuit.

35. The memory device according to claim 31, further comprising a light radiating portion for irradiating the ferroelectric substrate of each of the electric switches with light having a wavelength of 500 nm or less.

36. The memory device according to claim 31, further comprising a heating portion for heating the ferroelectric substrate of each of the electric switches.

37. The electric switch according to claim 1, wherein the ferroelectric substrate is changed to an insulator or a semiconductor by changing the direction of the polarization.

* * * * *

UNITED STATES PATENT AND TRADEMARK OFFICE
CERTIFICATE OF CORRECTION

PATENT NO. : 7,304,880 B2
APPLICATION NO. : 10/555941
DATED : December 4, 2007
INVENTOR(S) : Mizuuchi et al.

It is certified that error appears in the above-identified patent and that said Letters Patent is hereby corrected as shown below:

Column 35, line 3 (claim 7): "SC" should read --Sc--.
Column 36, line 37 (claim 30): "ferroclectric" should read --ferroelectric--.

Signed and Sealed this

Eleventh Day of November, 2008

JON W. DUDAS
*Director of the United States Patent and Trademark Office*